(12) United States Patent
Tobita

(10) Patent No.: US 8,571,169 B2
(45) Date of Patent: Oct. 29, 2013

(54) SCANNING LINE DRIVING CIRCUIT

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 48 days.

(21) Appl. No.: 13/022,960

(22) Filed: Feb. 8, 2011

(65) Prior Publication Data

US 2011/0222645 A1 Sep. 15, 2011

(30) Foreign Application Priority Data

Mar. 11, 2010 (JP) ................................ 2010-054026

(51) Int. Cl.
*G11C 19/00* (2006.01)

(52) U.S. Cl.
USPC .................... 377/64; 377/69; 377/78; 377/79

(58) Field of Classification Search
None
See application file for complete search history.

(56) References Cited

U.S. PATENT DOCUMENTS

| | | | |
|---|---|---|---|
| 6,081,305 A | 6/2000 | Sato et al. | |
| 6,876,352 B1 | 4/2005 | Sato et al. | |
| 7,106,292 B2 * | 9/2006 | Moon | 345/100 |
| 7,436,923 B2 * | 10/2008 | Tobita | 377/64 |
| 7,636,412 B2 * | 12/2009 | Tobita | 377/64 |
| 7,724,864 B2 * | 5/2010 | Kim et al. | 377/64 |
| 7,787,585 B2 * | 8/2010 | Cheng et al. | 377/64 |
| 8,098,227 B2 * | 1/2012 | Lee et al. | 345/100 |
| 8,121,244 B2 * | 2/2012 | Kim | 377/64 |
| 2003/0227433 A1 | 12/2003 | Moon | |
| 2004/0165692 A1 * | 8/2004 | Moon et al. | 377/64 |
| 2005/0008114 A1 * | 1/2005 | Moon | 377/64 |
| 2006/0061562 A1 * | 3/2006 | Park et al. | 345/204 |
| 2006/0256066 A1 | 11/2006 | Moon | |
| 2007/0274433 A1 * | 11/2007 | Tobita | 377/64 |
| 2007/0296681 A1 * | 12/2007 | Kim et al. | 345/100 |
| 2008/0001904 A1 * | 1/2008 | Kim et al. | 345/100 |
| 2008/0219401 A1 * | 9/2008 | Tobita | 377/79 |
| 2009/0115792 A1 | 5/2009 | Otose et al. | |
| 2009/0129535 A1 * | 5/2009 | Chen | 377/69 |
| 2010/0158188 A1 * | 6/2010 | Lee et al. | 377/79 |

FOREIGN PATENT DOCUMENTS

| | | |
|---|---|---|
| JP | 9-26583 | 1/1997 |
| JP | 2000-338937 | 12/2000 |
| JP | 2001-147674 | 5/2001 |

(Continued)

OTHER PUBLICATIONS

Office Action dated Jul. 2, 2013, in Japanese Patent Application No. 2010-054026, filed Mar. 11, 2010 (with English-language Translation), 4 pages.

*Primary Examiner* — Tuan T Lam

(74) *Attorney, Agent, or Firm* — Oblon, Spivak, McClelland, Maier & Neustadt, L.L.P.

(57) ABSTRACT

Provided are a bi-directional scanning type gate line driving circuit that does not require a dummy unit shift register and a method of driving the same. In a gate line driving circuit including a multi-stage shift register capable of bi-directional shifting, a start pulse is input to a unit shift register at a first stage and a unit shift register at the last stage of the multi-stage shift register. In forward shifting, a clock signal supplied to the unit shift register at the last stage is kept at a deactivation level during a period from a time at which an activation period of an output signal of the unit shift register at the last stage ends to a time at which the start pulse is activated during a subsequent frame period.

9 Claims, 14 Drawing Sheets

(56) References Cited

FOREIGN PATENT DOCUMENTS

| JP | 2004-157508 | 6/2004 |
| JP | 2007-293995 | 11/2007 |
| JP | 2009-134845 | 6/2009 |
| JP | 2010-049721 | 3/2010 |

* cited by examiner

F I G. 5
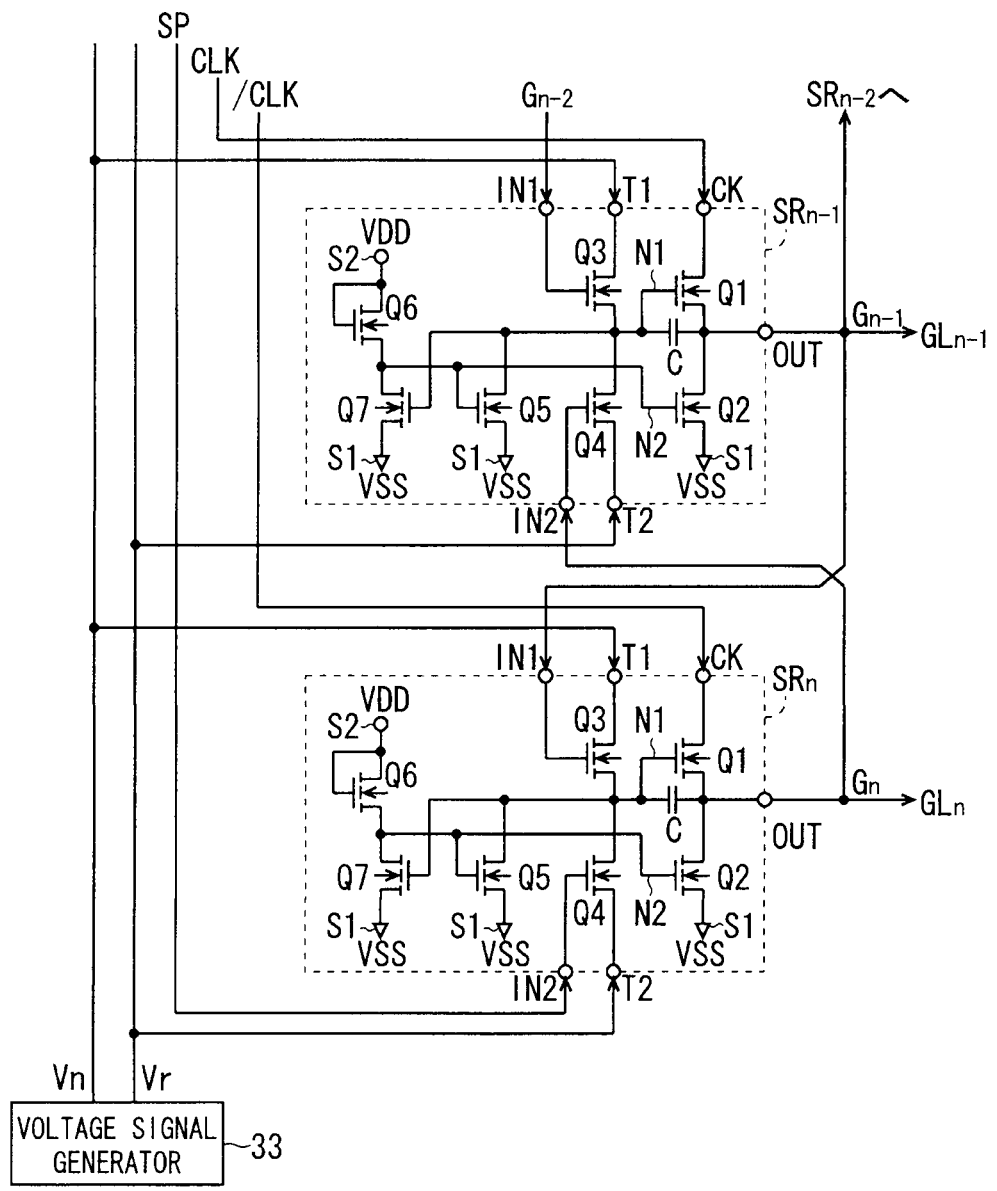

F I G. 8
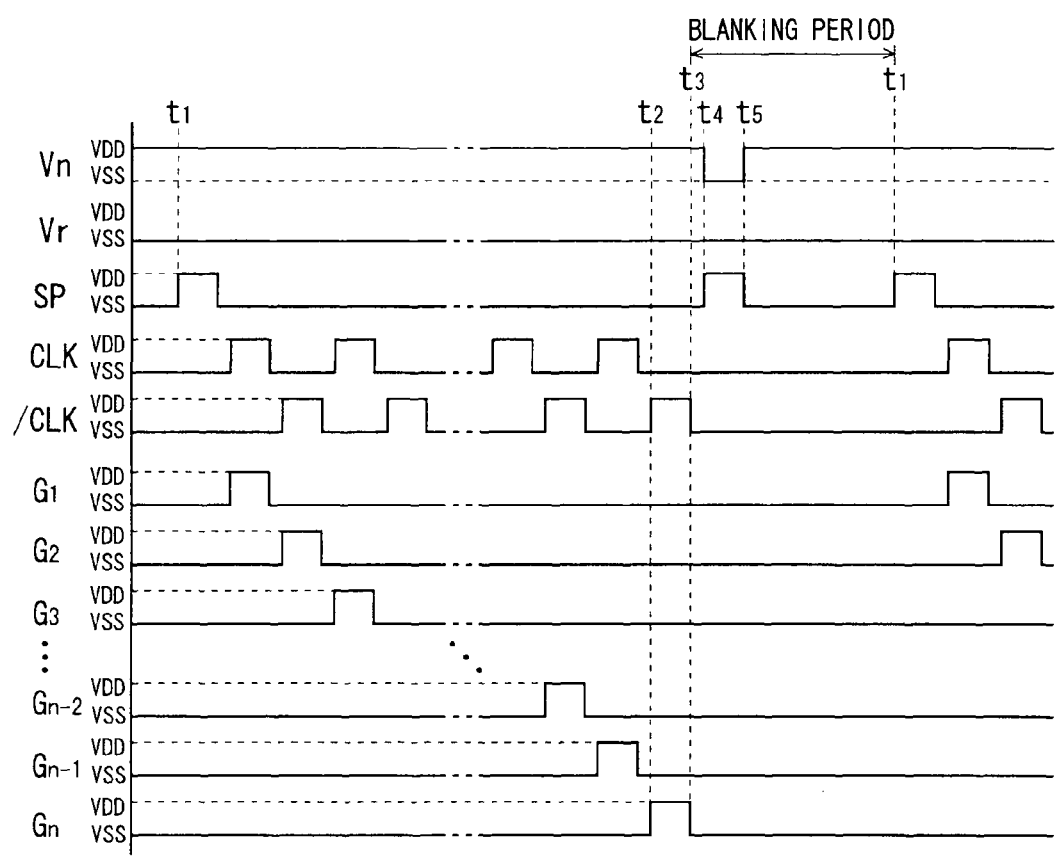

F I G. 1 1
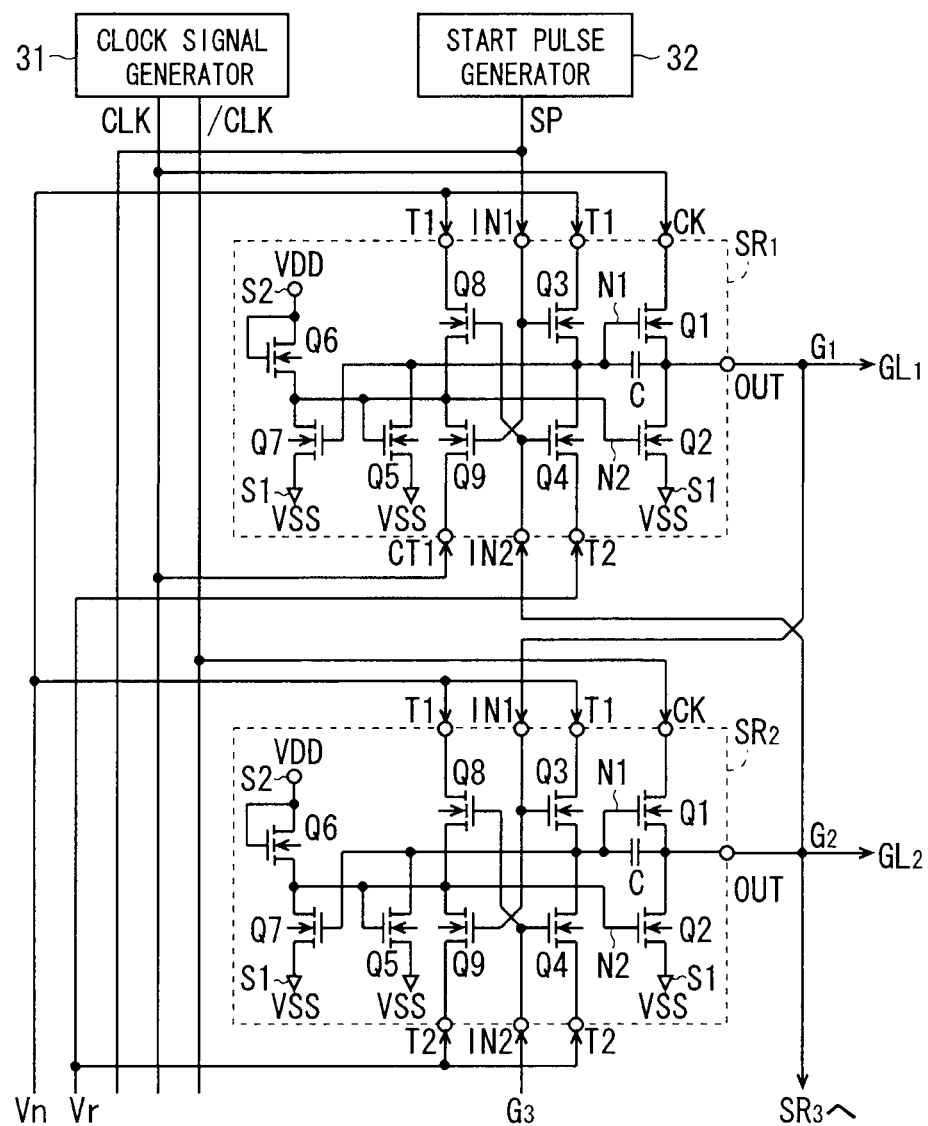

F I G. 1 2
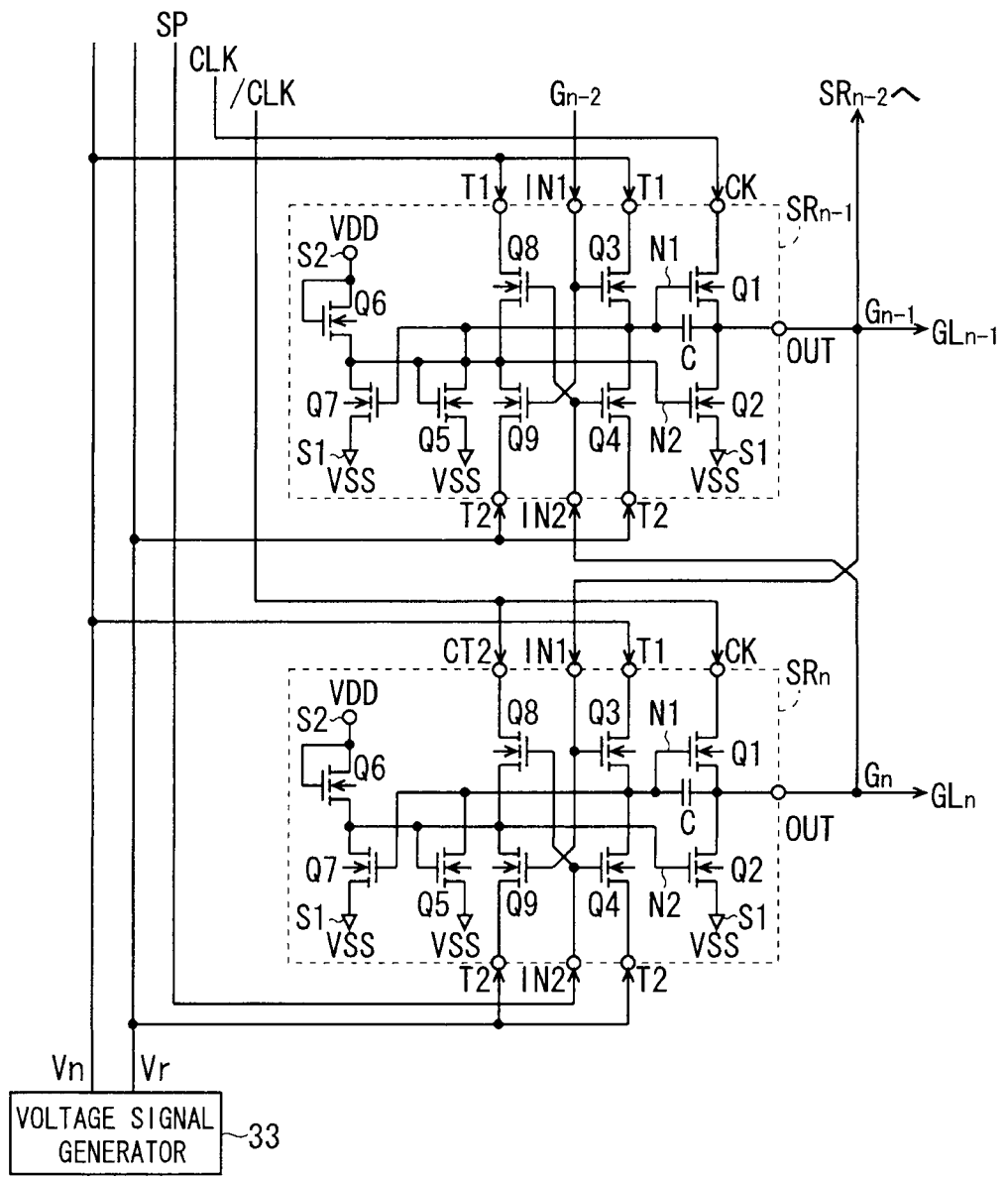

SCANNING LINE DRIVING CIRCUIT

BACKGROUND OF THE INVENTION

1. Field of the Invention

The present invention relates to a scanning line driving circuit used in, for example, an image display device or an electro-optical device such as an image sensor, and particularly, to a scanning line driving circuit that includes a shift register having a structure in which only electric field transistors of the same conductivity type are used and is capable of bi-directional scanning.

2. Description of the Background Art

An electro-optical device including a scanning line driving circuit that scans pixels connected to scanning lines is widely known. For example, in an image display device (hereinafter, referred to as a "display device") such as a liquid crystal display device, a gate line (scanning line) is provided for each pixel row (pixel line) of a display element (display panel) in which a plurality of pixels are arranged in matrix, where display images are updated by sequentially selecting and driving the gate lines in a cycle of one horizontal period of a display signal. As a scanning line driving circuit (gate line driving circuit) for sequentially selecting and driving the pixel lines, that is, gate lines, there may be used a shift register that performs a round of shift operation in one frame period of a display signal.

Further, pixels of an imaging element used in an imaging device are disposed in matrix, and the data of the taken image is extracted by scanning those pixels by the gate line driving circuit. A shift register can be also used in the gate line driving circuit of the imaging device.

The gate line driving circuit using shift registers includes a plurality of cascade-connected shift register circuits provided, each of which is provided for each scanning line (gate line). Herein, each of a plurality of shift register circuits forming the gate line driving circuit is referred to as a "unit shift register".

The shift registers used in the gate line driving circuit desirably consist of field effect transistors of the same conductivity type for reducing the number of steps in a manufacturing process for a display device. Therefore, for example, Japanese Patent Application Laid-Open No. 2004-157508 proposes a shift register consisting of n-type or p-type field effect transistors and a display device mounting the same.

FIG. 16 of Japanese Patent Application Laid-Open No. 2004-157508 shows an example of a gate line driving circuit that is driven by clock signals of two phases and is capable of bi-directional scanning. In the gate line driving circuit of FIG. 16, two dummy unit shift registers (dummy stage 0 and dummy stage 1) are used in addition to unit shift registers (SRC1 to SRC4) that actually drive gate lines. The dummy unit shift register (dummy stage 1) provided further downstream of the last stage (SRC4) is provided for resetting the last stage (SRC4) during scanning in a forward direction (from SRC1 to SRC4). The dummy unit shift register (dummy stage 0) provided further upstream of the first stage (SRC1) is provided for resetting the first stage (SRC1) during scanning in a backward direction (from SRC4 to SRC1).

As described above, in Japanese Patent Application Laid-Open No. 2004-157508, two dummy unit shift registers are provided in addition to the circuits that actually drive the gate lines, and accordingly the area required for forming the gate line driving circuit increases by an amount of the increase. An increase in area for forming the circuit is not preferred because it leads to an increase in cost of a display device.

SUMMARY OF THE INVENTION

An object of the present invention is to provide a bi-directional scanning type gate line driving circuit that does not require a dummy unit shift resister, and a method of driving the same.

A scanning line driving circuit according to the present invention includes a multi-stage shift register. Each stage of the multi-stage shift register includes: an output terminal for outputting an output signal; a first input terminal receiving an output signal of a preceding stage; a second input terminal receiving an output signal of a subsequent stage; a first voltage signal terminal supplied with a first voltage signal; a second voltage signal terminal supplied with a second voltage signal; a clock terminal; and first to fourth transistors described below. The first transistor supplies a clock signal input to the clock terminal to the output terminal. The second transistor discharges the output terminal. The third transistor includes a control electrode connected to the first input terminal and is connected between a first node connected with a control electrode of the first transistor and the first voltage signal terminal. The fourth transistor includes a control electrode connected to the second input terminal and is connected between the first node and the second voltage signal terminal. Each stage of the multi-stage shift register changes a scanning direction by switching levels of the first and second voltage signals.

The first input terminal at the first stage and the second input terminal at the last stage of the multi-stage shift register receive the same start pulse. After a lapse of an activation period of an output signal at a specific stage of the multi-stage shift register, a clock signal supplied to the clock terminal at the specific stage is kept at a deactivation level until the start pulse is activated during a next frame period, the specific stage being activated last during a frame period.

According to the present invention, a dummy unit shift register is not required, and thus an area required for forming the scanning line driving circuit can be prevented from increasing, which contributes to a cost reduction of an electro-optical device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 and 5 are circuit diagrams of the gate line driving circuit according to the first preferred embodiment;

FIG. 8 is a timing chart showing an operation during forward shifting in a gate line driving circuit according to a first modification of the first preferred embodiment;

FIGS. 11 and 12 are circuit diagrams of the gate line driving circuit according to the second modification of the first preferred embodiment;

DESCRIPTION OF THE PREFERRED EMBODIMENT

Figure 1:
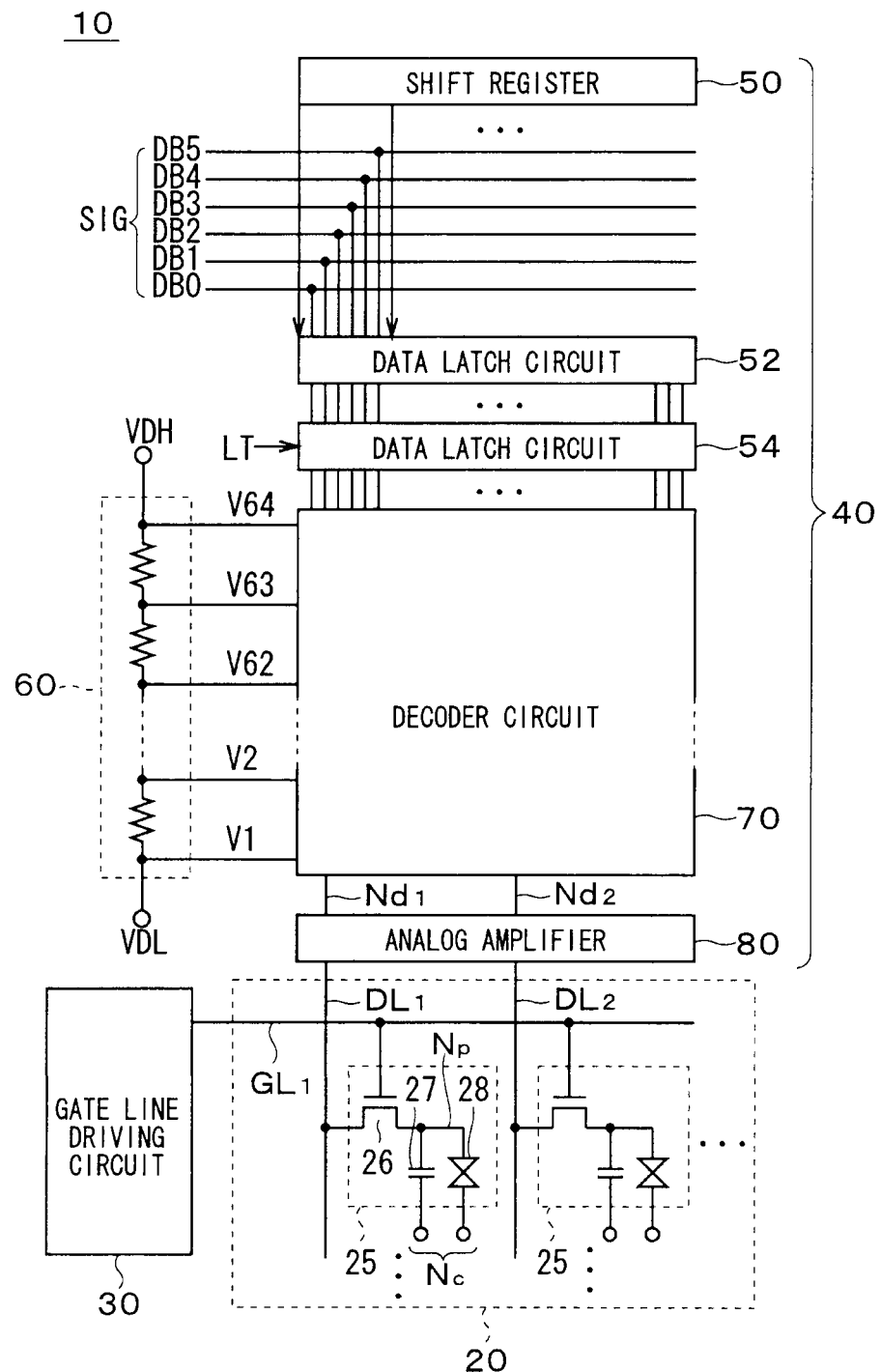
FIG. 1 is a schematic block diagram showing a configuration of a liquid crystal display device according to a first preferred embodiment.

Hereinafter, a preferred embodiment of the present invention will be described with reference to the drawings. To avoid repetition and redundancy of description, elements having the same or equivalent functions are denoted by the same reference numerals or characters in the drawings.

Further, the transistor used in the preferred embodiment is an insulated gate field effect transistor. In the insulated gate field effect transistor, the electrical conductivity between a drain region and a source region in a semiconductor layer is controlled by an electric field in a gate insulating film. For example, polysilicon, amorphous silicon, an organic semiconductor such as pentacene, single-crystal silicon, and an oxide semiconductor such as In—Ga—Zn—O (IGZO) may be used as the materials for the semiconductor layer in which the drain region and the source region are formed.

As widely known, transistors are element each having at least three electrodes including a control electrode (in a more limited sense, gate (electrode)), one current electrode (in a more limited sense, drain (electrode) or source (electrode)), and the other current electrode (in a more limited sense, source (electrode) or drain (electrode)). The transistor functions as a switching element in which a channel is formed between the drain and source by application of a predetermined voltage to the gate. The drain and source of the transistor basically have the same structure, which are referred to in an opposite manner depending on the conditions of the voltage to be applied. For example, in a case of an n-type transistor, an electrode having a relatively higher potential (hereinafter, also referred to as "level") and an electrode having a relatively lower potential are referred to as the drain and the source, respectively (which are opposite in a case of a p-type transistor).

Unless particularly noted, such transistors may be formed on a semiconductor substrate, or may be thin film transistors (TFTs) formed on an insulating substrate such as glass. The substrate on which a transistor is formed may be a single-crystal substrate or an insulating substrate such as SOL glass and resin.

The gate line driving circuit according to the present invention is composed of only transistors of a single conductivity type. For example, an n-type transistor attains an activated state (on state, conducting state) at a high (H) level at which a voltage between the gate and source is higher than a threshold voltage of the transistor, or attains a deactivated state (off state, non-conducting state) at a low (L) level at which the voltage is lower than the threshold voltage. Accordingly, in a circuit using n-type transistors, an H level and an L level of a signal are the "activation level" and the "deactivation level", respectively. Further, respective nodes of the circuit formed of n-type transistors change from the deactivation level to the activation level by being charged to attain the H level or change from the activation level to the deactivation level by being discharged to attain the L level.

In contrast, a p-type transistor attains the activation state (on state, conducting state) at the L level at which a voltage between the gate and source is lower than a threshold voltage of the transistor (negative value with the source as the reference), or attains the deactivation state (off state, non-conducting state) at the H level at which the voltage is higher than the threshold voltage. Accordingly, in a circuit using p-type transistors, an L level and an H level of a signal are the "activation level" and the "deactivation level", respectively. Further, the p-type transistor has the relationship between charging and discharging opposite to that of the n-type transistor, where respective nodes of the circuit formed of p-type transistors change from the deactivation level to the activation level by being charged to attain the L level or change from the activation level to the deactivation level by being discharged to attain the H level.

Herein, a change from the deactivation level to the activation level and a change from the activation level to the deactivation level are defined as "pull-up" and "pull-down", respectively. That is, a change from the L level to the H level and a change from the H level to the L level are defined as "pull-up" and "pull-down", respectively in the circuit using n-type transistors, while a change from the H level to the L level and a change from the L level to the H level are defined as "pull-up" and "pull-down", respectively in the circuit using p-type transistors.

Herein, further, while "connection" between two elements, between two nodes, or between one element and one node is the connection through another element (element or switch), description will be given considering that it includes a state equivalent to the state in which the connection therebetween is made directly. For example, even in a case where two elements are connected through a switch, those two elements are represented as being "connected" when those are capable of functioning similarly as in the case of being directly connected.

In the present invention, clock signals having phases different from each other (multiphase clock signals) are individually used. For brevity of description, a certain interval is provided between an activation period of one clock signal and an activation period of a clock signal activated thereafter (for example, interval between a time $t_3$ and a time $t_4$ of FIG. 13. In the present invention, however, the above-mentioned interval does not need to be provided unless the activation periods of the respective clock signals actually overlap one another. For example, if the activation level is the H level, falling (change from an H level to an L level) timing of one clock signal and rising (change from an L level to an H level) timing of the clock signal activated thereafter may coincide with each other.

First Preferred Embodiment

FIG. 1 is a schematic block diagram showing a configuration of a display device according to the present invention, which shows an overall configuration of a liquid crystal display device as a representative display device. Note that the application of the present invention is not limited to a liquid crystal display device, and the present invention is widely applicable to, for example, an electroluminescense (EL), organic EL, plasma display and electronic paper that is a display device converting an electric signal into light brightness, and an electro-optical device such as an imaging device (image sensor) that converts the light intensity into an electric signal.

A liquid crystal display device 10 includes a liquid crystal array unit 20, a gate line driving circuit (scanning line driving circuit) 30 and a source driver 40. As will be apparent from the description below, shift registers according to this preferred embodiment are mounted in the gate line driving circuit 30.

The liquid crystal array unit 20 includes a plurality of pixels 25 disposed in matrix. Gate lines $GL_1$, $GL_2$, ... (collectively referred to as "gate lines GL") are disposed in respective pixel rows of the pixels (hereinafter, also referred to as "pixel lines"), and data lines $DL_1$, $DL_2$, ... (collectively referred to as "data lines DL") are disposed in respective columns of the pixels (hereinafter, also referred to as "pixel columns"). FIG. 1 representatively shows the pixels 25 of the first column and the second column and the gate line $GL_1$ and the data lines $DL_1$ and $DL_2$ corresponding thereto.

Each pixel 25 includes a pixel switching element 26 provided between the corresponding data line DL and a pixel node Np, and a capacitor 27 and a liquid crystal display element 28 that are connected in parallel between the pixel node Np and a common electrode node Nc. The orientation of liquid crystals of the liquid crystal display element 28 changes in accordance with a voltage difference between the pixel node Np and the common electrode node Nc, and in accordance with the change, the display brightness of the liquid crystal display element 28 changes. This makes it possible to control the brightness of each pixel by a display voltage transmitted to the pixel node Np through the data line DL and the pixel switching element 26. That is, the intermediate brightness can be obtained by applying, between the pixel node Np and the common electrode node Nc, the intermediate voltage difference between a voltage difference corresponding to a maximum brightness and a voltage difference corresponding to a minimum brightness. Accordingly, it is possible to obtain the brightness gradation by stepwise setting of the display voltages.

The gate line driving circuit 30 selects and activates the gate lines GL sequentially based on a predetermined scanning cycle. Gate electrodes of the pixel switching elements 26 are connected to the gate lines GL respectively corresponding thereto. While a specific gate line GL is selected, in each pixel connected thereto, the pixel switching element 26 is rendered conductive and the pixel node Np is connected to the data line DL corresponding thereto. Then, the display voltage transmitted to the pixel node Np is held by the capacitor 27. Generally, the pixel switching element 26 includes a TFT formed on the insulating substrate (for example, glass substrate or resin substrate) on which the liquid crystal display element 28 is formed as well.

The source driver 40 is provided for outputting, to the data line DL, the display voltage that is set stepwise by a display signal SIG being an N-bit digital signal. It is assumed here that as an example, the display signal SIG is a 6-bit signal and is composed of display signal bits DB0 to DB5. It is possible to perform, in each pixel, display in $2^6$=64 levels based on the display signal SIG of 6 bits. Further, it is possible to perform color display in approximately 260,000 colors by forming one color display unit by three pixels of red (R), green (G) and blue (B).

Further, as shown in FIG. 1, the source driver 40 includes a shift register 50, data latch circuits 52 and 54, a gradation voltage generating circuit 60, a decoder circuit 70 and an analog amplifier 80.

In the display signal SIG, the display signal bits DB0 to DB5 each corresponding to the display brightness of the pixel 25 are generated in a serial manner. That is, the display signal bits DB0 to DB5 at the respective timings represent the display brightness in any one of the pixels 25 of the liquid crystal array unit 20.

The shift register 50 instructs the data latch circuit 52 to fetch the display signal bits DB0 to DB5 at the timing synchronized with the cycle when the setting of the display signal SIG is switched. The data latch circuit 52 fetches the serially-generated display signals SIG and holds the display signals SIG for one pixel line.

A latch signal LT input to the data latch circuit 54 is activated at the timing at which the data latch circuit 52 fetches the display signals SIG for one pixel line. Upon this, the data latch circuit 54 fetches the display signals SIG for one pixel line that are held in the data latch circuit 52.

The gradation voltage generating circuit 60 includes sixty-three voltage dividing resistors connected in series between a high voltage VDH and a low voltage VDL and respectively generate gradation voltages V1 to V64 of sixty-four levels.

The decoder circuit 70 decodes the display signals SIG held in the data latch circuit 54 and selects the voltages to be output to respective decoding output nodes $Nd_1$, $Nd_2$, ... (collectively referred to as "decoder output nodes Nd") from the gradation voltages V1 to V64 based on the decoding results and outputs the selected voltages.

As a result, the display voltages (ones among the gradation voltages V1 to V64) corresponding to the display signals SIG for one pixel line held in the data latch circuit 54 are output to the decoder output nodes Nd at the same time (in parallel). Note that FIG. 1 representatively shows the decoder output nodes $Nd_1$ and $Nd_2$ corresponding to the data lines $DL_1$ and $DL_2$ of the first and second columns, respectively.

The analog amplifier 80 performs current amplification of analog voltages corresponding to the display voltages corresponding to the respective display voltages output to the decoder output nodes $Nd_1$, $Nd_2$, ... from the decoder circuit 70 and outputs those voltages to the data lines $DL_1$, $DL_2$, ..., respectively.

The source driver 40 repeatedly outputs the display voltages corresponding to a series of display signals SIG to the data lines DL for an amount of each pixel line based on a predetermined scanning cycle. Then, the gate line driving circuit 30 sequentially drives the gate lines $GL_1$, $GL_2$, ... in synchronization with the scanning cycle. As a result, an image based on the display signal SIG appears on the liquid crystal array unit 20.

While FIG. 1 shows the configuration of the liquid crystal display device 10 in which the gate line driving circuit 30 and the source driver 40 are formed integrally with the liquid crystal array unit 20, it is possible to integrally form the gate line driving circuit 30 and the liquid crystal array unit 20 and provide the source driver 40 as an external circuit of the liquid crystal array unit 20. Alternatively, it is possible to provide the gate line driving circuit 30 and the source driver 40 as external circuits of the liquid crystal array unit 20.

Figure 2:
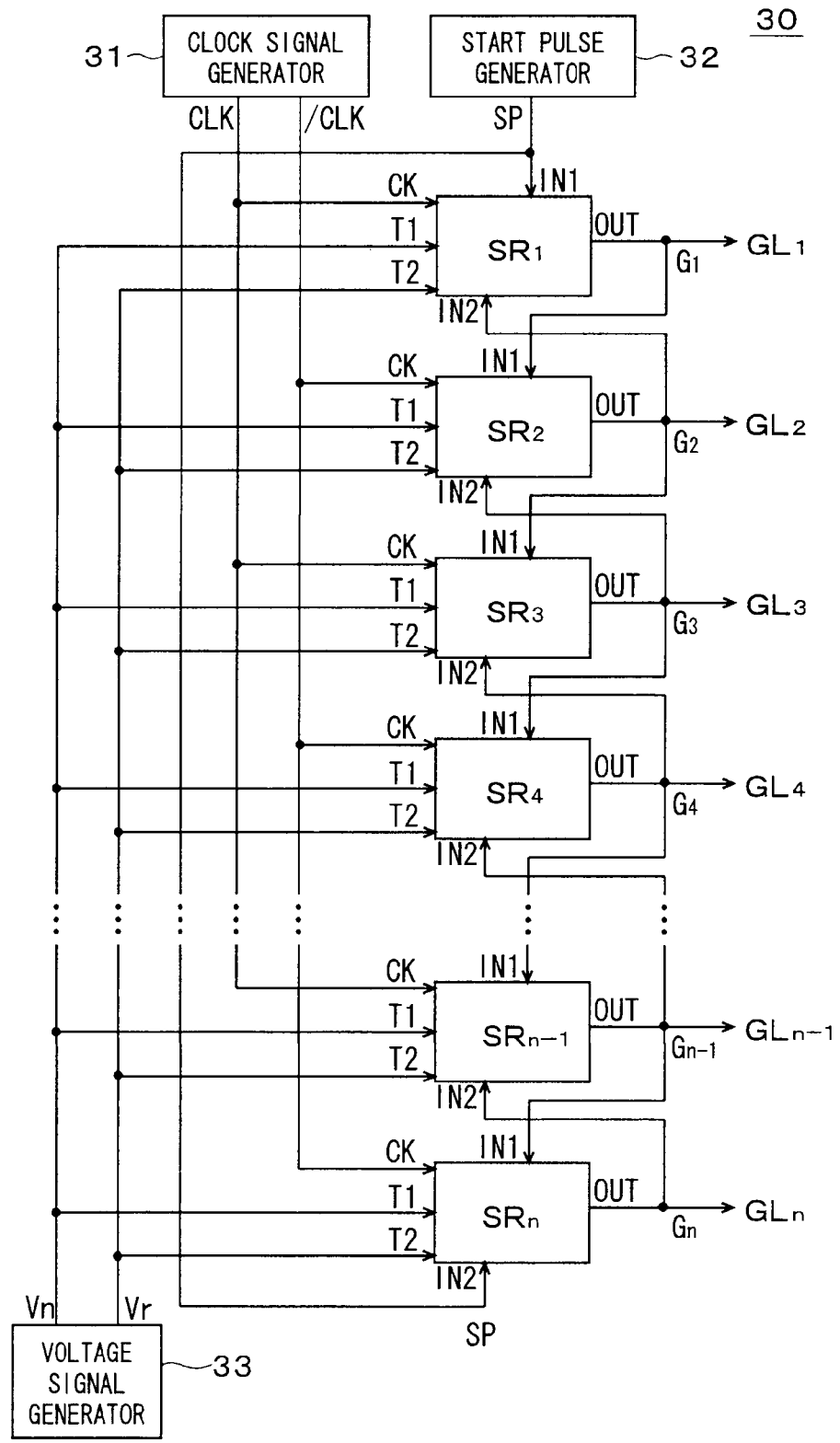
FIG. 2 is a diagram showing a configuration of a gate line driving circuit according to the first preferred embodiment.

FIG. 2 shows the configuration of the gate line driving circuit 30 according to this preferred embodiment. The gate line driving circuit 30 is formed of bi-directional shift registers capable of changing a shift direction of a signal. That is, the gate line driving circuit 30 includes a multi-stage shift register composed of n number of bi-directional unit shift registers $SR_1$, $SR_2$, $SR_3$, ..., $SR_n$ that are cascade-connected (hereinafter, the unit shift registers $SR_1$, $SR_2$, ..., $SR_n$ are collectively referred to as "unit shift registers SR"). One unit shift register SR is provided per pixel line, that is, gate line GL.

A clock signal generator 31 shown in FIG. 2 inputs clock signals CLK and /CLK of two phases that have phases different from each other to the unit shift registers SR of the gate line driving circuit 30. Those clock signals CLK and /CLK have phases opposite to each other and are controlled so as to be alternately activated at the timing synchronized with the scanning cycle of the display device.

A start pulse generator 32 generates a start pulse SP activated at the timing corresponding to the start of each frame period of an image signal.

A voltage signal generator 33 generates a first voltage signal Vn and a second voltage signal Vr that determine the shift direction of the signal in the bi-directional shift register. The first and second voltage signals Vn and Vr are complementary to each other and, in a case where a signal is shifted in a direction from a preceding stage to a subsequent stage (order of the unit shift registers $SR_1$, $SR_2$, $SR_3$, ...) (this direction is defined as a "forward direction"), the voltage signal generator 33 brings the first voltage signal Vn to the H level and the second voltage signal Vr to the L level. In contrast, in a case where a signal is shifted in a direction from a subsequent stage to a preceding stage (order of the unit shift registers $SR_n$, $SR_{n-1}$, $SR_{n-2}$, ...) (this direction is defined as a "backward direction"), the voltage signal generator 33 brings the second voltage signal Vr to the H level and the first voltage signal Vn to the L level.

Each of the unit shift registers SR includes a first input terminal IN1, a second input terminal IN2, an output terminal OUT, a clock terminal CK, a first voltage signal terminal T1 and a second voltage signal terminal T2.

In each unit shift register SR, the output terminal OUT for outputting an output signal G is connected to the gate line GL corresponding thereto. That is, the output signal G of each unit shift register SR serves as a vertical (or horizontal) scanning pulse for activating the gate line GL.

One of the clock signals CLK and /CLK is input to the clock terminal CK of each unit shift register SR such that a clock signal different from those of preceding and subsequent unit shift registers SR adjacent thereto is input. In the example of FIG. 2, the clock signal CLK is supplied to the unit shift registers $SR_1$, $SR_3$, $SR_5$, ... at the odd-numbered stages, while the clock signal /CLK is supplied to the unit shift registers $SR_2$, $SR_4$, $SR_6$, ... at the even-numbered stages. It is assumed here that n is an even number, and that the clock signal /CLK is supplied to the unit shift register $SR_n$ at the last stage.

The start pulse SP output by the start pulse generator 32 is input to the first input terminal IN1 of the unit shift register $SR_1$ at the first stage and to the second input terminal IN2 of the unit shift register $SR_n$ at the n-th stage that is the last stage. The first input terminals IN1 of the unit shift registers SR at the second and subsequent stages are connected to the output terminals OUT at their preceding stages. Further, the second input terminals IN2 at the stages except for the n-th stage are connected to the output terminals OUT of their subsequent stages.

Further, the first voltage signal Vn output from the voltage signal generator 33 is input to the first voltage signal terminals T1 of the respective unit shift registers SR, and the second voltage signal Vr is input to the second voltage signal terminals T2 of the respective unit shift registers SR. The shift directions of signals in the respective unit shift registers SR are shifted upon change in levels of the first and second voltage signals Vn and Vr.

Each unit shift register SR shifts the output signal G at the preceding stage in terms of time to transmit it to the unit shift register SR at the subsequent stage in a case of forward shifting, while in a case of backward shifting, each unit shift register SR shifts the output signal G at the subsequent stage in terms of time to transmit it to the unit shift register SR at the preceding stage (the operation of the unit shift register SR will be described below in detail). As a result, a series of unit shift registers SR functions as a so-called gate line driving unit that sequentially activates the gate lines GL at the timings based on a predetermined scanning cycle.

Figure 3:
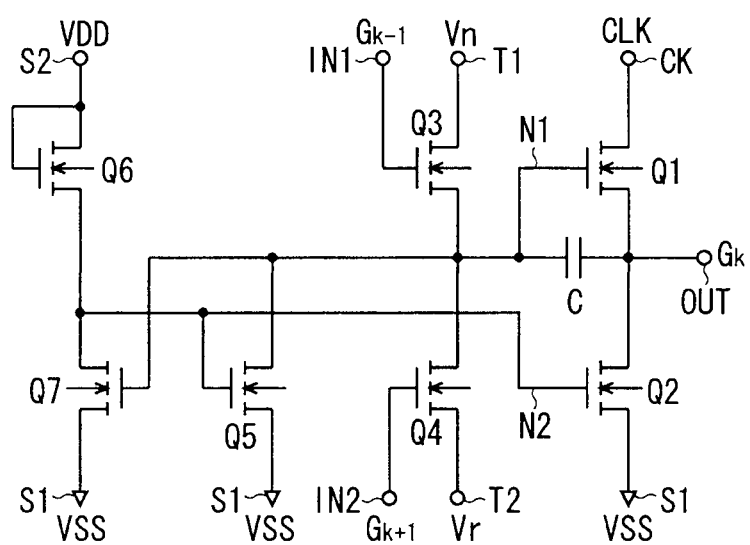
FIG. 3 is a circuit diagram showing an example of a unit shift register applicable to the gate line driving circuit according to the first preferred embodiment.
Figure 4:
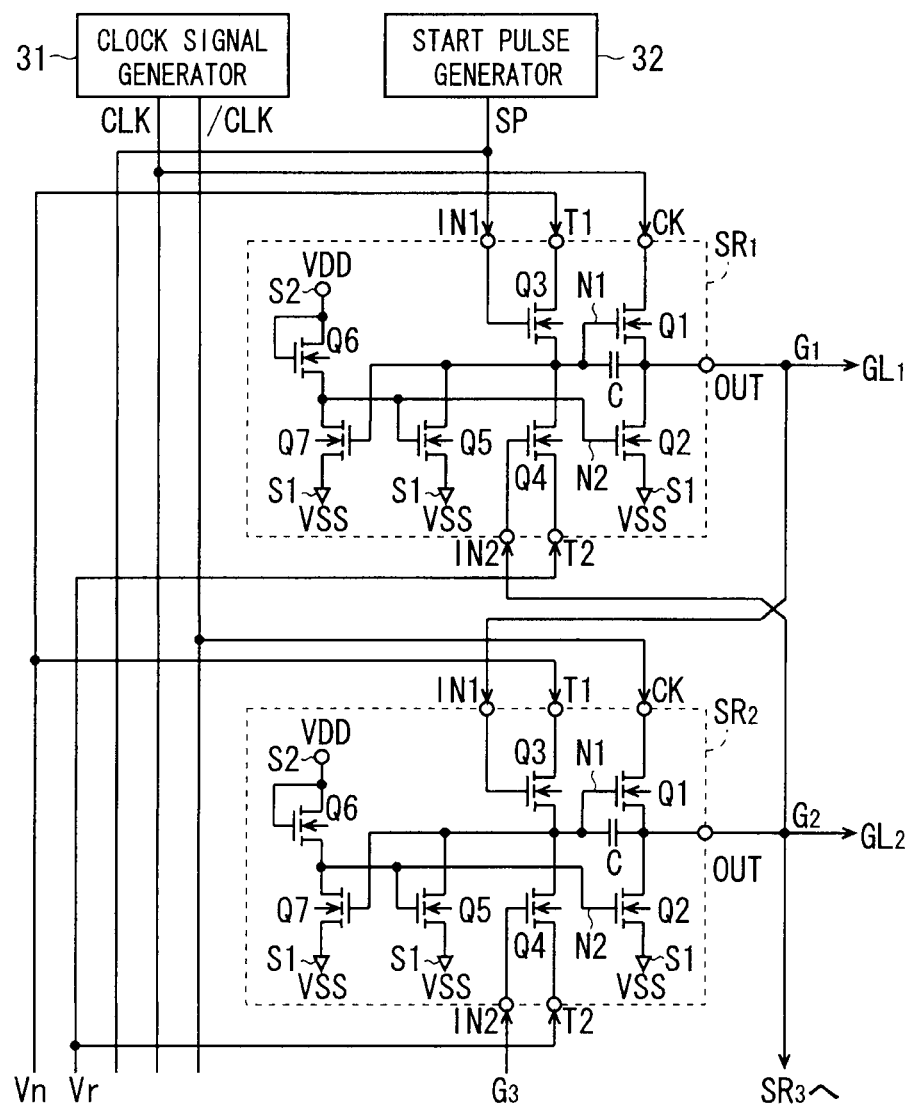

FIG. 3 shows an example of the unit shift register SR applicable to the gate line driving circuit 30 according to this preferred embodiment. In addition, FIG. 4 and FIG. 5 are circuit diagrams of the gate line driving circuit 30 including the unit shift registers SR of FIG. 3. FIG. 4 shows part corresponding to the unit shift registers $SR_1$ and $SR_2$ at the first two stages (first stage and second stage), and FIG. 5 shows part corresponding to the unit shift registers $SR_{n-1}$ and $SR_n$ at the last two stages ((n−1)th stage and n-th stage) thereof.

In the gate line driving circuit 30, the configurations of the respective unit shift registers SR are substantially the same, and thus a unit shift register $SR_k$ at the k-th stage will be described below as an example. Further, the transistors forming the unit shift register SR are all field effect transistors of the same conductivity type, which are n-type TFTs here.

The unit shift register $SR_k$ includes the first and second input terminals IN1 and IN2, the output terminal OUT, the clock terminal CK and the first and second voltage signal terminals T1 and T2 that are shown in FIG. 2, and besides, a first power supply terminal S1 supplied with a low-potential-side power supply potential VSS (hereinafter, referred to as "low-side power supply potential") and a second power supply terminal S2 supplied with a high-potential-side power supply potential VDD (hereinafter, referred to as "high-side power supply potential"). While the low-side power supply potential VSS is regarded as a reference potential (=0 V) in the following description, in actual use, the reference potential is set based on the voltage of the data to be written into a pixel and, for example, the high-side power supply potential VDD and the low-side power supply potential VSS are set to 17 V and −12 V, respectively.

The output stage of the unit shift register $SR_k$ includes a transistor Q1 connected between the output terminal OUT and the clock terminal CK and a transistor Q2 connected between the output terminal OUT and the first power supply terminal S1. The transistor Q1 is an output pull-up transistor that supplies the output terminal OUT with a clock signal input to the clock terminal CK to bring an output signal $G_k$ to an activation level (H level). The transistor Q2 is an output pull-down transistor that supplies the output terminal OUT with the potential of the first power supply terminal S1 to keep the output signal $G_k$ at a deactivation level (L level). The node connected with a gate (control electrode) of the transistor Q1 and the node connected with a gate of the transistor Q2 that form the output stage of the unit shift register SR are defined as a "node N1" and a "node N2", respectively.

Connected between the node N1 and the first voltage signal terminal T1 is a transistor Q3, and a gate thereof is connected to the first input terminal IN1. Connected between the node N1 and the second voltage signal terminal T2 is a transistor Q4, and a gate thereof is connected to the second input terminal IN2. Further, connected between the node N1 and the first power supply terminal S1 is a transistor Q5 whose gate is connected to the node N2. The transistor Q5 functions so as to keep the node N1 at the deactivation level (L level) during the period when the node N2 is at the activation level (H level).

Connected between the node N2 and the second power supply terminal S2 is a transistor Q6 and connected between the node N2 and the first power supply terminal S1 is a transistor Q7. The transistor Q6 has a gate connected to the second power supply terminal S2 similarly to the drain, which is so-called diode-connected. The gate of the transistor Q7 is connected to the node N1.

The transistor Q7 is set to have a much smaller on-resistance compared with the transistor Q6. Accordingly, when the node N1 attains the H level and the transistor Q7 is turned on, the node N2 is discharged to attain the L level. In contrast, the transistor Q7 is turned off when the node N1 is at the L level, and thus the node N2 is charged by the transistor Q6 to attain the H level. That is, the transistors Q6 and Q7 form a ratio inverter with the node N1 as an input end and the node N2 as an output end. This inverter functions as a "pull-down driving circuit" that drives the transistor Q2 (output pull-down transistor).

The operation of the unit shift register $SR_k$ of FIG. 3 will be described. For brevity of description, it is assumed that the clock signal CLK is input to the clock terminal CK of the unit shift register $SR_k$ (for example, unit shift registers $SR_1$ and $SR_3$ at odd-numbered stages correspond to this). As to the clock signals CLK and /CLK, the first and second voltage signals Vn and Vr, and the start pulse SP, it is assumed that the potential at the H level (activation level) is equal to the high-side power supply potential VDD and the potential at the L level (deactivation level) is equal to the low-side power supply potential VSS (=0). Moreover, it is assumed that the threshold voltages of the respective transistors forming the unit shift register $SR_k$ are equal to each other, and that the value thereof is Vth.

Description will be given of the operation of the unit shift register $SR_k$ when the gate line driving circuit 30 performs a forward shift operation (hereinafter, merely referred to as "in forward shifting" as well). In forward shifting, the first voltage signal Vn supplied to the first voltage signal terminal T1 is set to the H level (VDD), and the second voltage signal Vr supplied to the second voltage signal terminal T2 is set to the L level (VSS). Accordingly, the transistor Q3 functions as a transistor that charges (pulls up) the node N1, and the transistor Q4 functions as a transistor that discharges (pulls down) the node N1.

First, the node N1 is assumed to be at the L level (VSS) as an initial state of the unit shift register $SR_k$. The transistor Q7 is turned off in this case, whereby the node N2 is at the H level (VDD-Vth). In addition, it is assumed in the initial state that the clock signal CLK, the output signal $G_{k-1}$ at the preceding stage (unit shift register $SR_{k-1}$) and the output signal $G_{k+1}$ at the subsequent stage (unit shift register $SR_{k+1}$) are all at the L level.

In the state where the node N1 is at the L level and the node N2 is at the H level (hereinafter, referred to as a "reset state"), the transistor Q1 is turned off and the transistor Q2 is turned on, whereby the output signal $G_k$ of the unit shift register $SR_k$ is kept at the L level irrespective of the level of the clock signal CLK. That is, the gate line $GL_k$ connected to the unit shift register $SR_k$ is in a non-selection state. Further, in the reset state, the transistor Q5 is turned on and the node N1 is kept at the L level with low impedance.

When the output signal $G_{k-1}$ at the preceding stage (in the case of the first stage, start pulse SP as a start pulse) attains the H level from that state, the transistor Q3 is turned on, and the node N1 attains the H level (VDD-Vth). Upon this, the transistor Q7 is turned on and the node N2 attains the L level (≈VSS: potential determined in accordance with the on-resistance ratio between the transistors Q6 and Q7). As a result of the node N1 attaining the H level and the node N2 attaining the L level (hereinafter, referred to as a "set state") in this manner, the transistor Q1 is turned on and the transistor Q2 is turned off.

After that, the transistor Q3 is turned off as a result of the output signal $G_{k-1}$ at the preceding stage returning to the L level, but the node N1 attains the H level in a floating state, whereby the set state of the unit shift register $SR_k$ is kept.

Then, the clock signal CLK attains the H level. The transistor Q1 is turned on and the transistor Q2 is turned off, whereby the output terminal OUT is charged, which raises the level of the output signal $G_k$. On this occasion, the voltage of the node N1 is boosted by coupling through a parasitic capacitance (capacitive components between the gate and source, between the gate and drain, and between the gate and the channel) of the transistor Q1 and a capacitive element C. Accordingly, even if the level of the output terminal OUT is raised, the voltage between the gate and source of the transistor Q1 is kept to be larger than the threshold voltage (Vth), and the transistor Q1 is kept with low impedance.

Therefore, the output signal $G_k$ quickly attains the H level following rising of the clock signal CLK. Further, on this occasion, the transistor Q1 operates in a non-saturated region and charges the output terminal OUT, and accordingly the level of the output signal $G_k$ is raised up to the same potential VDD as that of the clock signal CLK without causing loss for the amount of the threshold voltage of the transistor Q1. As a result of the output signal $G_k$ attaining the H level in this manner, the gate like $GL_k$ is brought to a selection state.

When the clock signal CLK returns to the L level after that, the output terminal OUT is discharged by the transistor Q1 in the on state. Then, the output signal $G_k$ attains the L level (VSS), and the gate line $GL_k$ returns to the non-selection state. Further, the node N1 returns to the potential (VDD-Vth) before the voltage thereof is boosted.

On the other hand, the output signal $G_k$ of the unit shift register $SR_k$ is input to the first input terminal IN1 of the unit shift register $SR_{k+1}$ at the subsequent stage, and thus the unit shift register $SR_{k+1}$ has attained the set state when the output signal $G_k$ changed to the H level.

Accordingly, when the clock signal /CLK attains the H level, the output signal $G_{k+1}$ at the subsequent stage attains the H level. Then, in the unit shift register $SR_k$, the transistor Q4 is turned on, and the node N1 is discharged to attain the L level (VSS). Upon this, the transistor Q7 is turned off, and the node N2 is charged by the transistor Q6 to attain the H level (VDD-Vth). That is, the unit shift register SR returns to the reset state, whereby the transistor Q1 is turned off, and the transistors Q2 and Q5 are turned on.

Then, the clock signal /CLK attains the L level and, at the same time, the output signal $G_{k+1}$ at the subsequent stage returns to the L level. While the transistor Q4 is turned off upon this, the transistor Q5 is turned on, and thus the node N1 is kept at the L level with low impedance.

Thereafter, a half-latch circuit composed of the transistors Q5 to Q7 keeps the node N1 and the node N2 at the L level and the H level, respectively until the output signal $G_{k-1}$ at the preceding stage is activated during a subsequent period, and thus the unit shift register $SR_k$ is kept in the reset state. Therefore, the output signal $G_k$ is kept at the L level with low impedance during a non-selection state of the gate line $GL_k$.

To summarize the above-mentioned forward shift operation, the unit shift register $SR_k$ keeps the reset state during a deactivation level of the output signal $G_{k-1}$ (in the case of the unit shift register $SR_1$, start pulse SP) at the preceding stage that is input to the first input terminal IN1. The transistor Q1 is turned off and the transistor Q2 is turned on in the reset state, and accordingly the output signal $G_k$ is kept at the deactivation level (L level) with low impedance. Then, when the output signal $G_{k-1}$ at the preceding stage is activated, the unit shift register $SR_k$ is shifted to the set state. The transistor Q1 is turned on and the transistor Q2 is turned off in the set state, and accordingly the output signal $G_k$ is at the activation level (H level) during the period when the clock signal (clock signal CLK or /CLK) supplied to the clock terminal CK is activated. After that, when the output signal $G_{k+1}$ (in the case of the unit shift register $SR_n$, start pulse SP) at the subsequent stage that is input to the second input terminal IN2 is activated, the unit shift register $SR_k$ returns to the original reset state.

Figure 6:
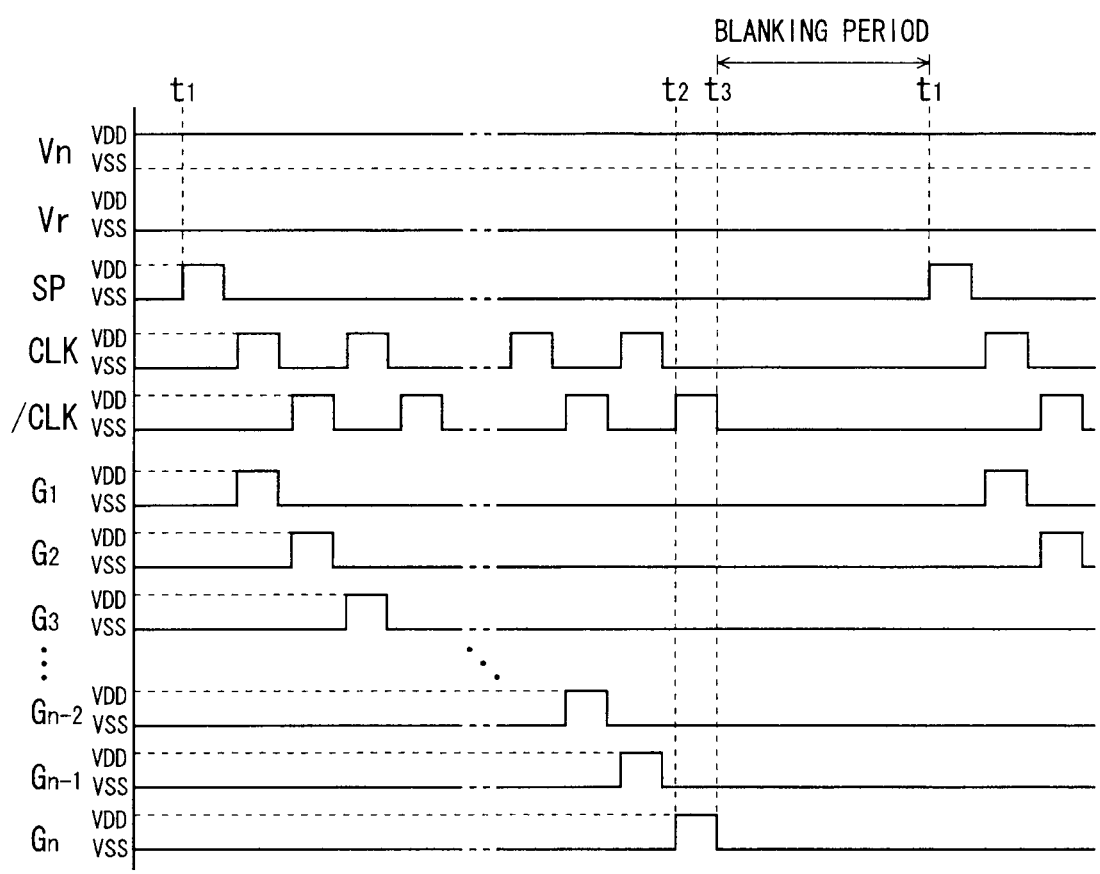
FIG. 6 is a timing chart showing an operation during forward shifting in the gate line driving circuit according to the first preferred embodiment.

As a result, in the gate line driving circuit 30 during forward shifting, as shown in the timing chart of FIG. 6, output signals $G_1, G_2, G_3, \ldots$ are activated in this order at the timings synchronized with the clock signals CLK and /CLK, with the activation (time $t_1$) of the start pulse SP as a trigger. As a result, the gate line driving circuit 30 is capable of driving the gate lines $GL_1, GL_2, GL_3, \ldots$ in this order in a predetermined scanning cycle.

Description is now given of the method of driving the gate line driving circuit 30 according to this preferred embodiment. As shown in FIG. 2 and FIG. 5, in this preferred embodiment, the start pulse SP is input also to the second input terminal IN2 of the unit shift register $SR_n$ at the last stage. For this reason, the timing at which the node N1 of the unit shift register $SR_n$ is discharged by the transistor Q4 in forward shifting is the timing at which the start pulse SP is activated at the start of each frame period (timing $t_1$ of FIG. 6).

Accordingly, when the unit shift register $SR_n$ attains the set state (where the node N1 is at the H level and the node N2 is at the L level) upon the activation of the output signal $G_{n-1}$ of the unit shift register $SR_{n-1}$, the unit shift register $SR_n$ does not immediately return to the reset state even after the output signal $G_n$ is activated at the end (from a time $t_2$ to the time $t_3$) of the frame period but returns to the reset state when the start pulse SP is activated (time $t_1$) during the next frame period (here, the leakage current of the node N1 is not taken into consideration). That is, the unit shift register $SR_n$ is kept in the set state also during a blanking period (from the time $t_3$ to the time $t_1$ of the next frame) between respective frame periods.

During the blanking period, the output signals $G_1$ to $G_n$ of the gate line driving circuit 30 are all required to be kept at the L level such that the gate lines GL all attain the deactivation state. However, if the unit shift register $SR_n$ is kept in the set state during the blanking period, a malfunction occurs in which the output signal $G_n$ attains the H level when the clock signal /CLK is activated.

Therefore, in the method of driving the gate line driving circuit 30 according to this preferred embodiment, the clock signal /CLK input to the clock terminal CK at the last stage (unit shift register $SR_n$) is kept at the deactivation level (L level) throughout the blanking period in forward shifting. The above-mentioned malfunction does not occur because the output signal $G_n$ of the unit shift register $SR_n$ is not activated unless the clock signal /CLK is activated.

The blanking period in forward shifting is defined as the period from the time $t_3$ when the activation period (selected period of the gate line $GL_n$) of the output signal $G_n$ that is activated last in the frame period to the time $t_1$ when the start pulse SP of the next frame is activated. While it suffices that the clock signal /CLK is kept at the deactivation level at least during that period, it is not preferable that the clock signal /CLK be activated simultaneously with the time $t_1$ when the blanking period ends.

At the time $t_1$, the node N1 of the unit shift register $SR_n$ is discharged and the transistor Q1 is turned off, and hence, in theory, the output signal $G_n$ is not activated even if the clock signal /CLK is activated at that time. However, depending on a discharge rate of the node N1, a malfunction occurs in which the timing at which the transistor Q1 is turned off delays and the output signal $G_n$ is activated at the time $t_1$. Accordingly, the timing at which the clock signal /CLK is activated after the blanking period is preferably delayed from the time $t_1$ to some extent. For example, the clock signal /CLK may be activated only after the end of the activation period of the start pulse SP even after the blanking period, as shown in FIG. 6.

While it suffices that in forward shifting, only the clock signal /CLK supplied to the clock terminal CK of the unit shift register $SR_n$ is kept at the deactivation level throughout the blanking period, the clock signals CLK and /CLK may be both kept at the deactivation level as shown in FIG. 6.

While in this preferred embodiment as described above, the unit shift register $SR_n$ at the last stage is kept in the set state during the blanking period in forward shifting, a malfunction of the unit shift register $SR_n$ can be prevented by keeping the clock signal /CLK supplied to the clock terminal CK of the unit shift register $SR_n$ at the deactivation level. Therefore, it is not required to provide a dummy unit shift register further downstream of the unit shift register $SR_n$.

Next, description will be given of the operation of the unit shift register SR in a case where the gate line driving circuit 30 performs a backward shift operation (hereinafter, merely referred to as "in backward shifting" as well). In backward shifting, the first voltage signal Vn supplied to the first voltage signal terminal T1 of each unit shift register SR is set to the L level (VSS), and the second voltage signal Vr supplied to the second voltage signal terminal T2 is set to the H level (VDD). Accordingly, contrary to the case of forward shifting, the transistor Q3 functions as a transistor that discharges (pulls down) the node N1, and the transistor Q4 functions as a transistor that charges (pulls up) the node N1. As a result, in the unit shift register SR at each stage, the operations of the transistor Q3 and the transistor Q4 are opposite to those in the case of forward shifting.

Therefore, the unit shift register $SR_k$ in backward shifting keeps the reset state during the deactivation period of the output signal $G_{k+1}$ (in the unit shift register $SR_n$, the start pulse SP) at a subsequent stage that is input to the second input terminal IN2, and the output signal $G_k$ is kept at the L level (VSS) with low impedance during that period. Upon the activation of the output signal $G_{k+1}$, the unit shift register $SR_k$ is switched to the set state, and the output signal $G_k$ is at the H level during a period when the clock signal (clock signal CLK or /CLK) supplied to the clock terminal CK is activated. After that, the output signal $G_{k-1}$ (in the unit shift register $SR_1$, the start pulse SP) at a preceding stage that is output to the first input terminal IN1 is activated, whereby the unit shift register $SR_k$ returns to the original reset state.

Figure 7:
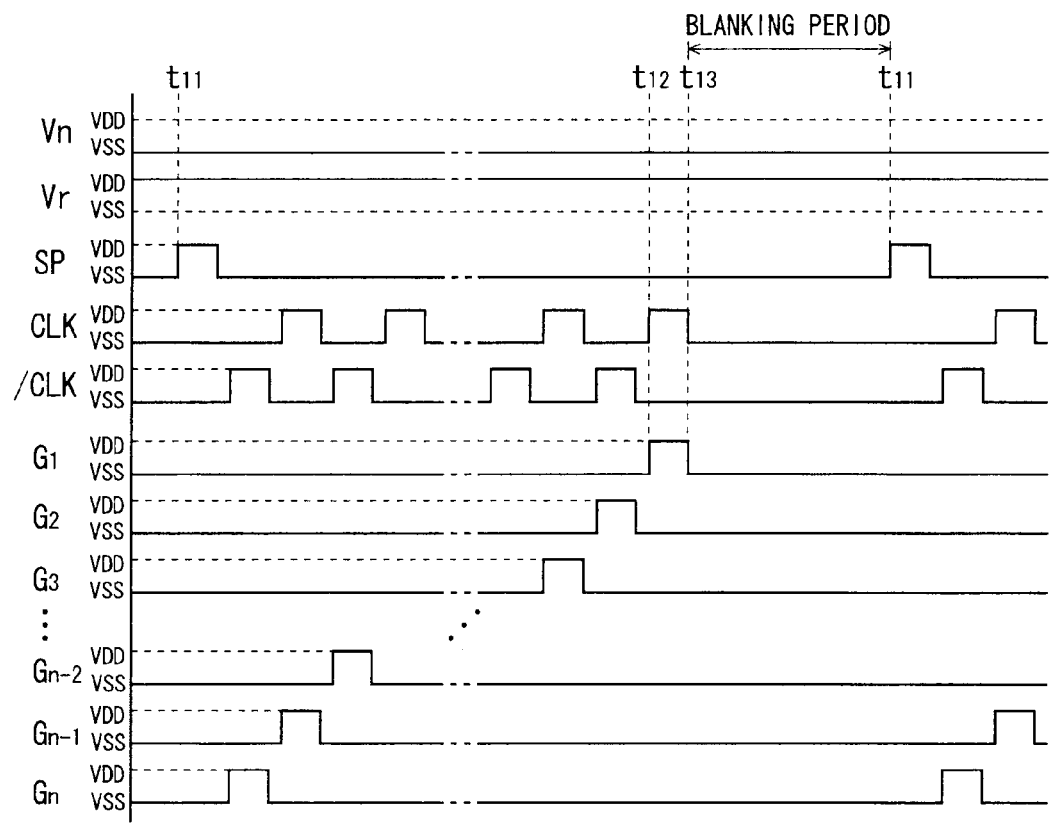
FIG. 7 is a timing chart showing an operation during backward shifting in the gate line driving circuit according to the first preferred embodiment.

As a result, in the gate line driving circuit 30 in backward shifting, as shown in the timing chart of FIG. 7, the output signals $G_n, G_{n-1}, G_{n-2}, \ldots$ are activated in this order at the timings synchronized with the clock signals CLK and /CLK, with the activation of the start pulse SP as a trigger. Accordingly, the gate line driving circuit 30 is capable of driving the gate lines $GL_n, GL_{n-1}, GL_{n-2}, \ldots$ in this order in a predetermined scanning cycle.

As shown in FIG. 2 and FIG. 4, in this preferred embodiment, the start pulse SP is input also to the first input terminal IN1 of the unit shift register $SR_1$ at the first stage. For this reason, the timing at which the node N1 of the unit shift register $SR_1$ is discharged by the transistor Q3 in backward shifting is the timing (timing $t_{11}$ of FIG. 7) at which the start pulse SP is activated at the start of each frame period.

Therefore, when the unit shift register $SR_1$ attains the set state (where the node N1 is at the H level and the node N2 is at the L level) upon the activation of the output signal $G_2$ of the unit shift register $SR_2$, the unit shift register $SR_1$ does not immediately return to the reset state even after the output signal $G_1$ is activated at the end (from a time $t_{12}$ to a time $t_{13}$) of the frame period but returns to the reset state when the start pulse SP is activated (time $t_{11}$) during the next frame period. That is, the unit shift register $SR_1$ is kept in the reset state also during the blanking period (from the time $t_{13}$ to the time $t_{11}$ of the next frame).

If the unit shift register $SR_1$ is in the set state during the blanking period, a malfunction occurs in which the output signal $G_1$ attains the H level when the clock signal CLK is activated. Therefore, in backward shifting, the clock signal CLK input to the clock terminal CK at the first stage (unit shift register $SR_1$) is kept at the activation level (L level) throughout the blanking period. The output signal $G_1$ of the unit shift register $SR_1$ is not activated unless the clock signal CLK is activated, and hence the above-mentioned malfunction does not occur.

The blanking period in backward shifting is defined as the period from the time $t_{13}$ at which the activation period (selected period of the gate line $GL_1$) of the output signal $G_1$ that is activated last during the frame period to the time $t_{11}$ at which the start pulse SP of the next frame is activated. While it suffices that the clock signal CLK is kept at the deactivation level at least during that period, for preventing a malfunction that the output signal $G_1$ is activated at the time $t_{11}$, the timing at which the clock signal CLK is activated after the blanking period is preferably delayed from the time $t_{11}$ to some extent. For example, as shown in FIG. 7, the clock signal CLK may be activated after the activation period of the start pulse SP ends even after the blanking period.

While in this preferred embodiment as described above, the unit shift register $SR_1$ at the first stage is kept in the set state during the blanking period in backward shifting, a malfunction of the unit shift register $SR_1$ can be prevented by keeping the clock signal CLK supplied to the clock terminal CK of the unit shift register $SR_1$ at the deactivation level. Therefore, it is not required to provide a dummy unit shift register further upstream of the unit shift register $SR_1$.

While it suffices that in backward shifting, only the clock signal CLK supplied to the clock terminal CK of the unit shift register $SR_1$ is kept at the deactivation level throughout the blanking period, the clock signals CLK and /CLK may be both kept at the deactivation level as shown in FIG. 7.

The description has been given of the case where the gate line driving circuit 30 is driven by the clock signals CLK and /CLK of two phases. Needless to say, the present invention is also applicable to the gate line driving circuit 30 driven by clock signals of three or more phases.

[First Modification]

In a scanning line driving circuit of an electro-optical device such as a liquid crystal display device, a transistor (a-Si transistor) formed using amorphous silicon (a-Si) is widely used. The a-Si transistor has such a property that a threshold voltage is shifted due to a gate thereof being biased continuously, leading to a fear that a malfunction may occur in the scanning line driving circuit.

For example, in the method of controlling the gate line driving circuit 30 shown in FIG. 6, the gate (node N1) of the transistor Q1 of the unit shift register $SR_n$ continues to be positively biased throughout the blanking period, and accordingly the threshold voltage of the transistor Q1 is shifted to a positive direction. As a result, the driving ability of the transistor Q1 degrades, and rising and falling rates of the gate line driving signal $S_n$ become slow. As a result, a problem arises where a display malfunction occurs in the liquid crystal array unit 20.

Figure 9:
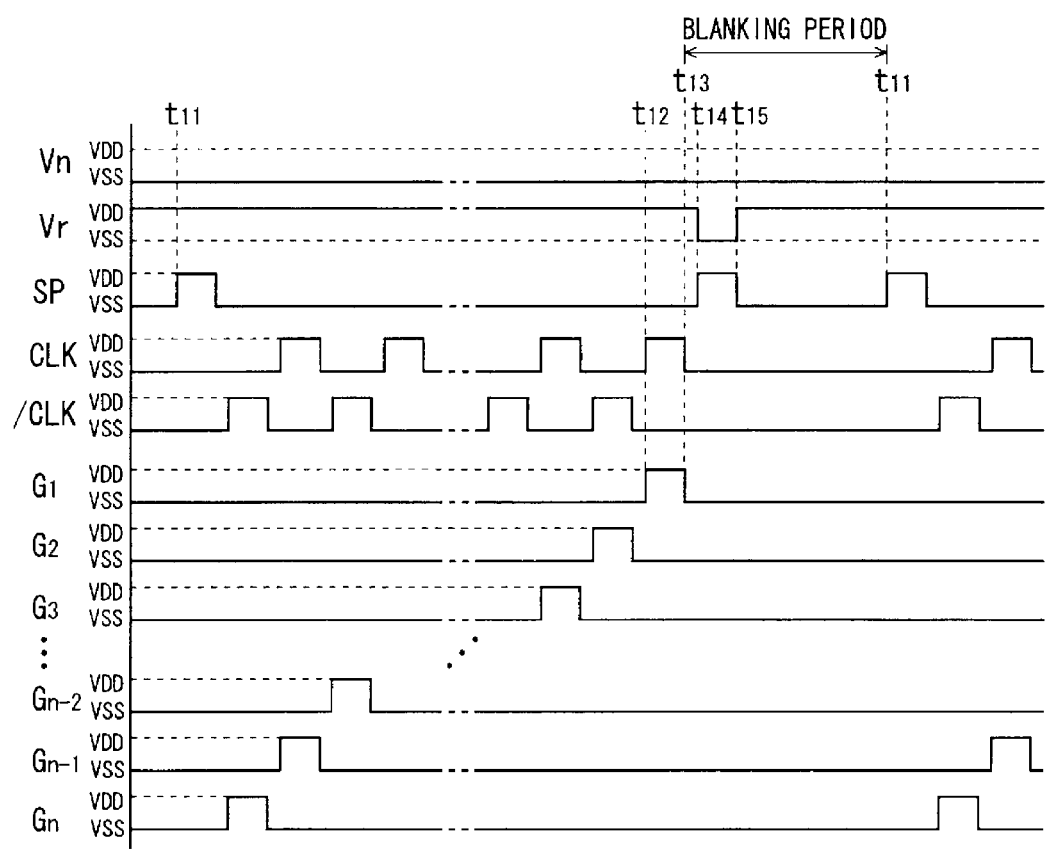
FIG. 9 is a timing chart showing an operation during backward shifting in the gate line driving circuit according to the first modification of the first preferred embodiment.

Here, the modification capable of preventing an occurrence of this problem is described in the method of driving the gate line driving circuit 30 according to the first preferred embodiment. FIG. 8 and FIG. 9 are charts for describing the method of driving the gate line driving circuit 30 according to the first modification of the first preferred embodiment. FIG. 8 is the timing chart showing the operation of the gate line driving circuit 30 in forward shifting, and FIG. 9 is the timing chart showing the operation of the gate line driving circuit 30 in backward shifting.

In forward shifting, as shown in FIG. 8, the first and second voltage signals Vn and Vr are both brought to the L level and the start pulse SP is brought to the H level for a certain period (from the time $t_4$ to a time $t_5$) immediately after the time $t_3$ at which the blanking period starts.

As a result of the start pulse SP being brought to the H level, the unit shift register $SR_n$ at the last stage attains the reset state. That is, the gate (node N1) of the transistor Q1 of the unit shift register $SR_n$ is discharged by the transistor Q4 to attain the L level. This prevents the gate of the transistor Q1 of the unit shift register $SR_n$ from being positively biased throughout the blanking period, and the above-mentioned problem can be prevented from occurring.

The first voltage signal Vn is brought to the L level when the start pulse SP is activated during a period from the time $t_4$ to the time $t_5$, so that the unit shift register $SR_1$ at the first stage is prevented from attaining the set state when the start pulse SP is activated during the blanking period, to thereby prevent the threshold voltage of the transistor Q1 of the unit shift register $SR_1$ from shifting in a positive direction. The start pulse SP is returned to the L level, and then the first voltage signal Vn is returned to the H level for the forward shift operation of the next frame.

Further, according to the method of driving the gate line driving circuit 30 of this modification, the first and second voltage signals Vn and Vr are brought to the L level and the start pulse SP is brought to the H level immediately after the start of the blanking period in forward shifting, with the result that the unit shift register $SR_n$ at the last stage can be brought to the reset state. Accordingly, there is no need to provide a dummy unit shift register further downstream of the unit shift register $SR_n$.

On the other hand, in backward shifting, as shown in FIG. 9, the first and second voltage signals Vn and Vr are both brought to the L level and the start pulse SP is brought to the H level for a certain period (from a time $t_{14}$ to a time $t_{15}$) immediately after the time $t_{13}$ at which the blanking period starts. As a result of the start pulse SP being brought to the H level, the unit shift register $SR_1$ at the first stage attains the reset state. That is, in backward shifting, the gate (node N1) of the transistor Q1 of the unit shift register $SR_1$ is discharged by the transistor Q3 to attain the L level at the time $t_{14}$ immediately after the start of the blanking period. Accordingly, the gate of the transistor Q1 of the unit shift register $SR_1$ is prevented from being positively biased throughout the blanking period, which prevents the occurrence of the above-mentioned problem.

The second voltage signal Vr is brought to the L level when the start pulse SP is activated during a period from the time $t_{14}$ to the time $t_{15}$ during the blanking period, so that the unit shift register $SR_n$ at the last stage is prevented from attaining the set state when the start pulse SP is activated during the blanking period, to thereby prevent the threshold voltage of the transistor Q1 of the unit shift register $SR_n$ from shifting in a positive direction. The start pulse SP is returned to the L level, and then the second voltage signal Vr is returned to the H level for the backward shift operation of the next frame.

Further, according to the method of driving the gate line driving circuit 30 of this modification, the first and second voltage signals Vn and Vr are brought to the L level and the start pulse SP is brought to the H level immediately after the start of the blanking period in backward shifting, with the result that the unit shift register $SR_1$ at the first stage can be brought to the reset state. Accordingly, there is no need to provide a dummy unit shift register further downstream of the unit shift register $SR_n$.

In this modification, attention is focused on the problem of the threshold voltage shift of the transistors Q1 of the unit shift registers $SR_1$ and $SR_n$, which results from the method of driving the gate line driving circuit 30 according to this preferred embodiment, and a countermeasure thereagainst is described. However, the unit shift register $SR_k$ of the gate line driving circuit 30 is kept in the reset state during most of the period (period from the activation of the output signal $G_{k+1}$ at the subsequent stage to the activation of the output signal $G_{k-1}$ at the preceding stage in the next frame). Accordingly, the gates (nodes N2) of the transistors Q2 and Q5 are positively biased continuously, and the threshold voltages of the transistors Q2 and Q5 are shifted. A countermeasure against this is disclosed in, for example, Japanese Patent Application Laid-Open No. 2007-250052 corresponding to patent application by the inventor of the present invention.

[Second Modification]

In order to achieve a high-resolution display device or imaging device, the gate line driving circuit 30 needs to be operated at high speed and, in each unit shift register SR, a higher-speed operation is required for the transistors Q1 and Q2 that activate and deactivate the output signal G. For that purpose, it is effective to increase the charging rates of the nodes N1 and N2 connected with the gates of the transistors Q1 and Q2, respectively.

However, in the unit shift register $SR_k$ of FIG. 3, for example, when the output signal at the preceding stage is activated in forward shifting, the node N1 is charged by the transistor Q3 to attain the H level. Upon this, the transistor Q7 is turned on, and the node N2 is discharged. That is, there is a delay equal to the charging time of the node N1 between the activation of the output signal $G_{k-1}$ at the preceding stage and discharging of the node N2. Moreover, the transistor Q5 is turned on when the transistor Q3 starts charging of the node N1, which is a cause of an increase in charging time of the node N1.

As a result of the output signal $G_{k+1}$ at the subsequent stage being activated, the node N1 is discharged by the transistor Q4 to attain the L level. Upon this, the transistor Q7 is turned off, and the node N2 is charged by the transistor Q6 to attain the H level. The transistors Q6 and Q7 form a ratio inverter, in which an on-resistance of the transistor Q6 is set to be large for reducing an offset at the L level that is output from the inverter and preventing a through current. This imposes limitations on an increase in charging rate of the node N2.

Figure 10:
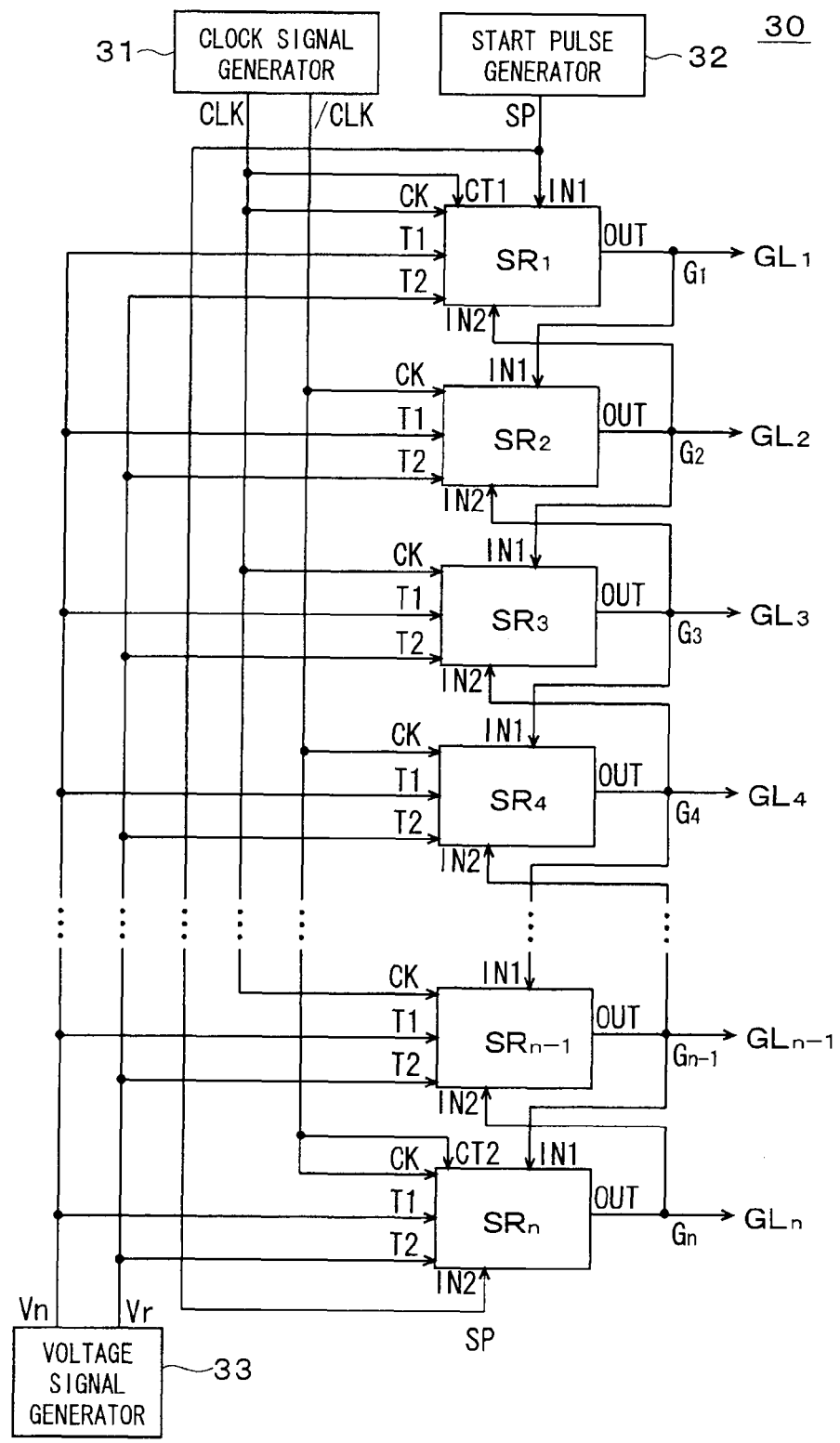
FIG. 10 is a diagram showing a configuration of a gate line driving circuit according to a second modification of the first preferred embodiment.

FIG. 10 is a block diagram of the gate line driving circuit 30 according to this modification. This gate line driving circuit 30 substantially has the same configuration as that of FIG. 2, but is provided with a first control signal terminal CT1 in the unit shift register $SR_1$ at the first stage and a second control signal terminal CT2 in the unit shift register $SR_n$ at the last stage. While the first control signal terminal CT1 and the second control signal terminal CT2 are respectively supplied with predetermined control signals, in this case, the clock signal CLK is used as a first control signal supplied to the first control signal terminal CT1 and the clock signal /CLK is used as a second control signal supplied to the second control signal terminal CT2. The technique of selecting the first and second control signals will be described below.

FIG. 11 and FIG. 12 are circuit diagrams of the gate line driving circuit 30 according to this modification. FIG. 11 shows the part corresponding to the unit shift registers $SR_1$ and $SR_2$ at the first two stages (first stage and second stage), and FIG. 12 shows the part corresponding to the unit shift registers $SR_1$ and $SR_2$ at the last two stages ((n−1)th stage and n-th stage).

In the gate line driving circuit 30 according to this modification, the unit shift register $SR_1$ at the first stage, the unit shift register $SR_n$ at the last stage and the unit shift registers $SR_2$ to $SR_{n-1}$ therebetween have configurations different from each other.

First, the unit shift registers $SR_2$ to $SR_{n-1}$ at the second stage to the (n−1)th stage will be described. The unit shift registers $SR_2$ to $SR_{n-1}$ all have the same configuration. As shown in the unit shift register $SR_2$ of FIG. 11 and the unit shift register of FIG. 12, each of the unit shift registers $SR_2$ to $SR_{n-1}$ has a configuration in which transistors Q8 and Q9 connected to the node N2 are provided in the circuit of FIG. 3. The transistor Q8 is connected between the node N2 and the first voltage signal terminal T1 and has a gate connected to the second input terminal IN2 (gate of the transistor Q4). The transistor Q9 is connected between the node N2 and the second voltage signal terminal T2 and has a gate connected to the first input terminal IN1 (gate of the transistor Q3). The transistors Q8 and Q9 have on-resistances that are much smaller than that of the transistor Q6.

The operation of the unit shift register $SR_k$ ($2 \leq k \leq n-1$) is not described here because it is substantially equal to that of the circuit of FIG. 3, which is different from the case of FIG. 3 in that charging/discharging of the node N2 is performed mainly by the transistors Q8 and Q9.

That is, in the unit shift register $SR_k$, for example, in forward shifting, the transistor Q9 is turned on immediately after the output signal $G_{k-1}$ at the preceding stage is activated, and starts discharging of the node N2. That is, differently from the circuit of FIG. 3, there is no delay corresponding to the charging time of the node N1 between the activation of the output signal $G_{k-1}$ at the preceding stage and the discharging of the node N2. Moreover, when the node N2 is discharged to attain the L level, the transistor Q5 is turned off, whereby the charging time of the node N1 is reduced as well.

Further, as a result of the output signal $G_{k+1}$ at the subsequent stage being activated, the node N1 is discharged by the transistor Q4 to attain the L level, and the transistor Q7 is turned off. In this case, the transistor Q8 is turned on to charge the node N2. The transistor Q8 is set to have a smaller on-resistance than that of the transistor Q6, and thus the charging rate of the node N2 becomes faster compared with the circuit of FIG. 3.

In backward shifting, the transistor Q8 is turned on immediately after the output signal $G_{k+1}$ at the subsequent stage is activated, and starts discharging of the node N2, whereby the charging time of the node N1 is reduced as in forward shifting. Further, the transistor Q9 is turned on and charges the node N2 as a result of the output signal $G_{k-1}$ at the preceding stage being activated, with the result that the charging rate of the node N2 becomes faster as in forward shifting.

As described above, the charging rates of the nodes N1 and N2 are fast in the unit shift register $SR_k$ according to this modification, and thus the transistors Q1 and Q2 are operated at higher speed, which contributes to higher resolution of a display device and an imaging device.

Contrary to the circuits of the unit shift registers $SR_2$ to $SR_{n-1}$, the unit shift register $SR_1$ at the first stage is obtained by connecting the transistor Q9 between the node N2 and the first control signal terminal CT1, as shown in FIG. 11. Further, contrary to the circuits of the unit shift registers $SR_2$ to $S_{n-1}$, the unit shift register $SR_n$ at the last stage is obtained by connecting the transistor Q8 between the node N2 and the second control signal terminal CT2, as shown in FIG. 12.

Figure 13:
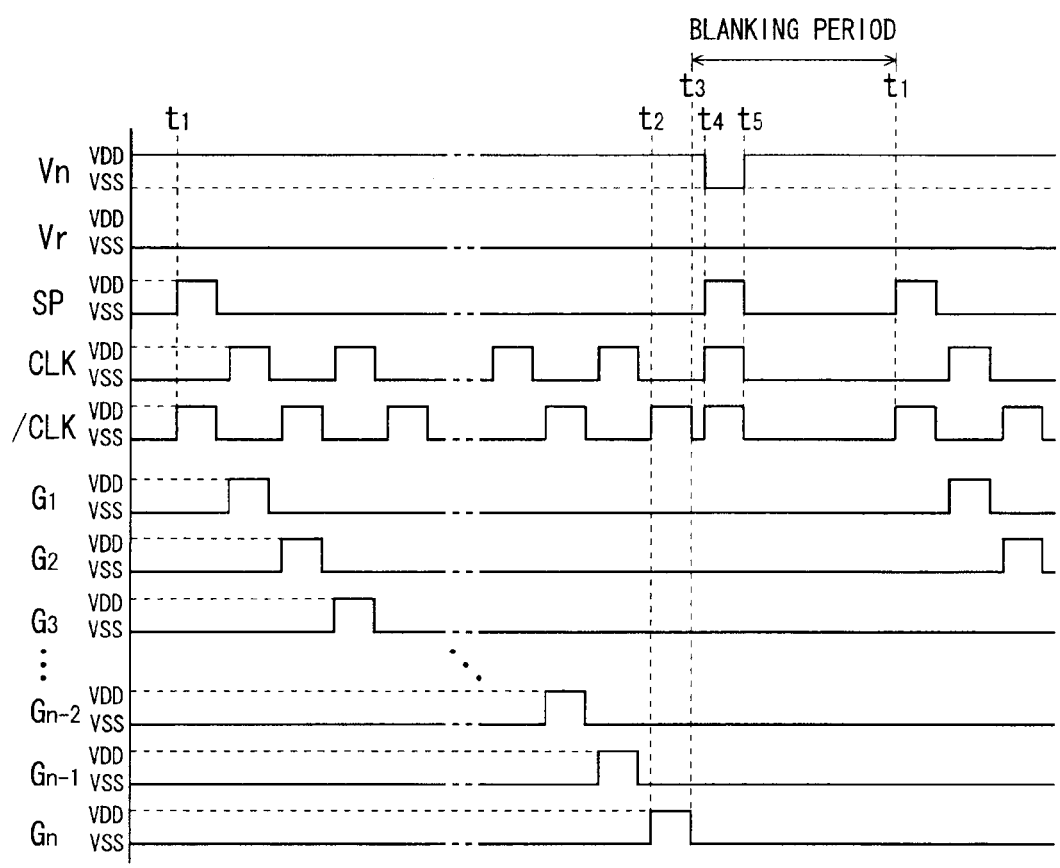
FIG. 13 is a timing chart showing an operation during forward shifting in the gate line driving circuit according to the second modification of the first preferred embodiment.

Description is now given of the method of driving the gate line driving circuit 30 according to this modification. FIG. 13 is a timing chart showing the operation of the gate line driving circuit 30 in forward shifting. In forward shifting, as shown in FIG. 13, at the time when the start pulse SP is activated at the start of the frame period (time $t_1$), the clock signal CLK as a first control signal supplied to the first control signal terminal CT1 of the unit shift register $SR_1$ is set to the L level, and the clock signal /CLK as a second control signal supplied to the second control signal terminal CT2 of the unit shift register $SR_n$ is set to the H level.

In this case, in the unit shift register $SR_1$, the transistor Q9 discharges the node N2 and the transistor Q3 charges the node N1, whereby the unit shift register $SR_1$ is set to the set state in which the node N1 is at the H level and the node N2 is at the L level.

On the other hand, in the unit shift register $SR_n$, the second control signal terminal CT2 (clock signal /CLK) is at the H level while the gate of the transistor Q8 is at the H level, and thus the node N2 is not discharged. Further, the second voltage signal terminal T2 (second voltage signal Vr) is set to the L level while the transistor Q4 of the unit shift register $SR_n$ is also turned on, and thus the node N1 is not charged as well. Accordingly, the unit shift register $SR_n$ is kept in the reset state in which the node N1 and the node N2 are at the L level and the H level, respectively.

Then, the start pulse SP and the clock signal /CLK (second control signal) are brought to the L level, where it is preferable that the clock signal /CLK be brought to the L level behind the start pulse SP. This is because the node N2 of the unit shift register $SR_n$ is discharged through the transistor Q8 if the clock signal /CLK attains the L level prior to the start pulse SP.

Thereafter, similarly to the gate line driving circuit 30 using the unit shift registers of FIG. 3, the respective unit shift registers SR operate, and the output signals $G_1, G_2, G_3, \ldots$ are sequentially activated.

When the output signal $G_{n-1}$ at the second from the last stage is activated, in the unit shift register $SR_n$, the transistor Q9 discharges the node N2 and the transistor Q3 charges the node N1, whereby the unit shift register $SR_n$ attains the set state in which the node N1 is at the H level and the node N2 is at the L level. The output signal $G_n$ of the unit shift register $SR_n$ returns to the L level during the activation period (from the time $t_2$ to the time $t_3$) of the clock signal /CLK.

In this modification, the first and second voltage signals Vn and Vr are both brought to the L level, and the start pulse SP and the clock signals CLK and /CLK that are the first and second control signals are both brought to the H level during a certain period (from the time $t_4$ to the time $t_5$) immediately after the time $t_3$ at which the blanking period starts.

On this occasion, in the unit shift register $SR_n$ at the last stage, the second control signal terminal CT2 (clock signal /CLK) is at the H level, and thus the transistor Q8 charges the node N2 to bring it to the H level. In addition, the second voltage signal terminal T2 (second voltage signal Vr) is at the L level, and thus the transistor Q4 discharges the node N1 to bring it to the L level. Accordingly, the unit shift register $SR_n$ attains the reset state.

In the unit shift register $SR_1$, the first voltage signal terminal T1 (first voltage signal Vn) is at the L level and the first control signal terminal CT1 (clock signal CLK) is at the H level while the transistors Q3 and Q9 are turned on, and accordingly, the unit shift register $SR_1$ is kept in the reset state in which the node N1 is at the L level and the node N2 at the H level.

As described above, according to the method of driving the gate line driving circuit 30 of this modification, the unit shift register $SR_n$ at the last stage can be brought to the reset state by bringing the first and second voltage signals Vn and Vr to the L level and the start pulse SP and the clock signals CLK and /CLK (first and second control signals) to the H level immediately after the start of the blanking period in forward shifting. Therefore, there is no need to provide a dummy unit shift register further downstream of the unit shift register $SR_n$.

When the first and second voltage signals Vn and Vr are brought to the L level and the start pulse SP and the clock signals CLK and /CLK are brought to the H level during the blanking period (at the time $t_4$), it is preferable that the clock signal /CLK (second control signal) attain the H level behind the start pulse SP. This is because such a malfunction that the output signal $G_n$ is activated occurs if the clock signal /CLK attains the H level before the node N1 of the unit shift register $SR_n$ is sufficiently discharged by the transistor Q4 (that is, before the transistor Q1 is turned off).

Figure 14:
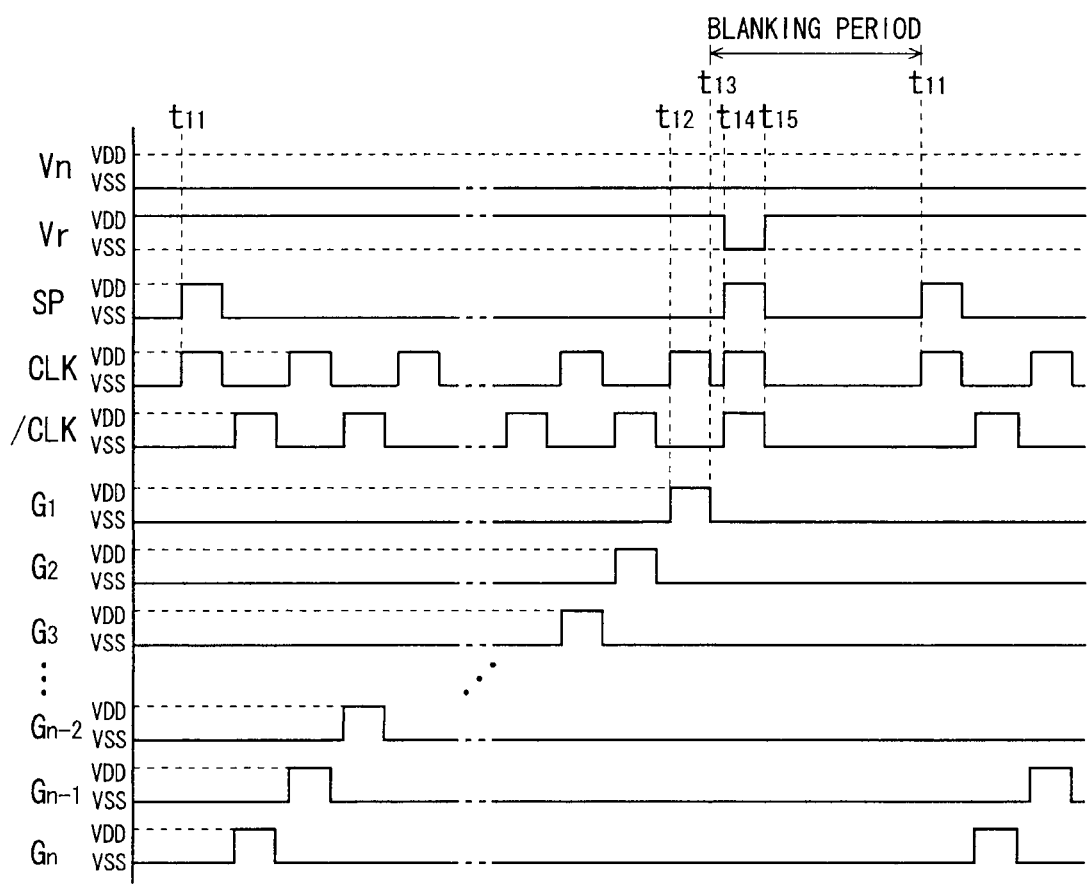
FIG. 14 is a timing chart showing an operation during backward shifting in the gate line driving circuit according to the second modification of the first preferred embodiment.

FIG. 14 is a timing chart showing the operation of the gate line driving circuit 30 in backward shifting. As shown in FIG. 14, in backward shifting, when the start pulse SP is activated at the start of the frame period (at the time $t_{11}$), the clock signal /CLK (second control signal) supplied to the second control signal terminal CT2 of the unit shift register $SR_n$ is set to the L level, and the clock signal CLK (first control signal) supplied to the first control signal terminal CT1 of the unit shift register SR, is set to the H level.

On this occasion, in the unit shift register $SR_n$, the transistor Q8 discharges the node N2 and the transistor Q4 charges the node N1, whereby the unit shift register $SR_n$ attains the set state in which the node N1 is at the H level and the node N2 is at the L level.

On the other hand, in the unit shift register $SR_1$, the first control signal terminal CT1 (clock signal CLK) is at the H level while the gate of the transistor Q9 attains the H level, and accordingly the node N2 is not discharged. The first voltage signal terminal T1 (first voltage signal Vn) is set to the L level while the transistor Q3 of the unit shift register $SR_1$ is turned on, and accordingly the node N1 is not charged. Therefore, the unit shift register $SR_1$ is kept in the reset state in which the node N1 is at the L level and the node N2 is at the H level.

After that, the start pulse SP and the clock signal CLK (first control signal) are brought to the L level, where it is preferred that the clock signal CLK be brought to the L level behind the start pulse SP. This is because the node N2 of the unit shift register $SR_1$ is discharged through the transistor Q9 if the clock signal CLK attains the L level prior to the start pulse SP.

Thereafter, the respective unit shift registers SR operate and the output signals $G_n, G_{n-1}, G_{n-2}, \ldots$ are sequentially activated, similarly to the gate line driving circuit 30 using the unit shift registers of FIG. 3.

Upon activation of the output signal $G_2$ at the second stage, in the unit shift register $SR_1$, the transistor Q8 discharges the node N2 and the transistor Q4 charges the node N1, with the result that the unit shift register $SR_1$ attains the set state in which the node N1 is at the H level and the node N2 is at the L level. The output signal $G_1$ of the unit shift register $SR_1$ attains the H level during the activation period (from the time $t_{12}$ to the time $t_{13}$) of the clock signal CLK.

In this modification, during a certain period (from the time $t_{14}$ to the time $t_{15}$) immediately after the time $t_{13}$ when the blanking period starts, the first and second voltage signals Vn and Vr are brought to the L level, and the start pulse SP and the clock signals CLK and /CLK (first and second control signals) are both brought to the H level.

On this occasion, in the unit shift register $SR_1$ at the first stage, the first control signal terminal CT1 (clock signal CLK) is at the H level, and thus the transistor Q9 charges the node N2 to bring it to the H level. In addition, the first voltage signal terminal T1 (first voltage signal Vn) is at the L level, and thus the transistor Q3 discharges the node N1 to bring it to the L level. Accordingly, the unit shift register $SR_1$ attains the reset state.

In the unit shift register $SR_n$, the second voltage signal terminal T2 (second voltage signal Vr) is at the L level and the second control signal terminal CT2 (clock signal /CLK) is at the H level while the transistors Q4 and Q8 are turned on, with the result that the unit shift register $SR_n$ is kept in the reset state in which the node N1 is at the L level and the node N2 is at the H level.

As described above, according to the method of driving the gate line driving circuit 30 of this modification, the unit shift register $SR_1$ at the first stage can be brought to the reset state by bringing the first and second voltage signals Vn and Vr to the L level and the start pulse SP and the clock signals CLK and /CLK (first and second control signals) to the H level immediately after the start of the blanking period in backward shifting. Therefore, there is no need to provide a dummy unit shift register further upstream of the unit shift register $SR_1$.

When the first and second voltage signals Vn and Vr are brought to the L level and the start pulse SP and the clock signals CLK and /CLK are brought to the H level during the blanking period (at the time $t_{14}$), it is preferable that the clock signal CLK (first control signal) be brought to the H level behind the start pulse SP. This is because such a malfunction that the output signal $G_1$ is activated occurs if the clock signal CLK attains the H level before the node N1 of the unit shift register $SR_1$ is sufficiently discharged by the transistor Q3 (that is, before the transistor Q1 is turned off).

Finally, description will be given of the method of selecting the first control signal supplied to the first control signal terminal CT1 and the second control signal supplied to the second control signal terminal CT2.

As is apparent from the operation of the unit shift register $SR_1$ descried above, the first control signal supplied to the first control signal terminal CT1 is controlled so as to satisfy two conditions below.

Conditional a1: in forward shifting, the first control signal attains the deactivation level during a period when the start pulse SP attains the activation level at the start of each frame period.

Condition a2: in backward shifting, the first control signal also attains the activation level during a period when the start pulse SP attains the activation level at the start of each frame period.

Further, as is apparent from the operation of the unit shift register $SR_n$, the second control signal supplied to the second control signal terminal CT2 is controlled so as to satisfy two conditions below.

Condition b1: in forward shifting, the second control signal also attains the activation level during a period when the start pulse SP attains the activation level at the start of each frame period.

Condition b2: in backward shifting, the second control signal attains the deactivation level during a period when the start pulse SP attains the activation level at the start of each frame period.

That is, it suffices that the first and second control signals are signals controllable so as to satisfy the above-mentioned four conditions at the start of each frame (time $t_1$ and time $t_{11}$) and controllable so as to both attain the activation level when the blanking period starts (time $t_4$ and time $t_{14}$). However, it is not preferred to separately prepare such control signals because this leads to an increase in the number of signal lines.

On the other hand, the clock signal that drives each unit shift register SR is basically unnecessary during the activation period of the start pulse SP and the blanking period (which does not affect the operation of the unit shift register SR), and accordingly the clock signal may function also as the first and second control signals. Then, there is no need to increase the number of signal lines. From this viewpoint, the clock signal CLK is used as the first control signal and the clock signal /CLK is used as the second control signal in this modification.

Further, in the configuration of the gate line driving circuit 30 shown in FIG. 10, originally, the clock signal CLK is a signal that is activated in a cycle satisfying the conditions a1 and a2, and the clock signal /CLK is a signal that is activated in a cycle satisfying the conditions b1 and b2. Accordingly, in a case where the clock signal CLK is used as the first control signal and the clock signal /CLK is used as the second control signal, the conditions a1, a2, b1 and b2 are inevitably satisfied without exceptionally controlling the clock signals CLK and /CLK at the start of each frame period (time $t_1$ or time $t_{11}$). This also leads to an advantage that control of the first and second control signals is simplified.

While the invention has been shown and described in detail, the foregoing description is in all aspects illustrative and not restrictive. It is therefore understood that numerous modifications and variations can be devised without departing from the scope of the invention.

What is claimed is:

1. A scanning line driving circuit comprising a multi-stage shift register, wherein:
   each stage of said multi-stage shift register comprises:
      an output terminal for outputting an output signal;
      a first input terminal receiving an output signal of a preceding stage;
      a second input terminal receiving an output signal of a subsequent stage;
      a first voltage signal terminal supplied with a first voltage signal;
      a second voltage signal terminal supplied with a second voltage signal;
      a clock terminal;
      a first transistor supplying a clock signal input to said clock terminal to said output terminal;
      a second transistor discharging said output terminal;
      a third transistor connected between a first node connected with a control electrode of said first transistor and said first voltage signal terminal and including a control electrode connected to said first input terminal; and a fourth transistor connected between said first node and said second voltage signal terminal and including a control electrode connected to said second input terminal;

each stage of said multi-stage shift register changes a scanning direction by switching levels of said first and second voltage signals;

said first input terminal at the first stage and said second input terminal at the last stage of said multi-stage shift register receive the same start pulse, the first stage and the last stage not being a dummy stage; and after a lapse of an activation period of an output signal at a specific stage of said multi-stage shift register, a clock signal supplied to said clock terminal at said specific stage is kept at a deactivation level until said start pulse is activated during a next frame period, said specific stage being activated last during a frame period.

2. The scanning line driving circuit according to claim 1, wherein for a certain period after a lapse of the activation period of the output signal at said specific stage, said first and second voltage signals are brought to the deactivation level and said start pulse is brought to an activation level.

3. The scanning line driving circuit according to claim 1, wherein:

in a case where a control electrode of said second transistor is connected to a second node at each stage of said multi-stage shift register, the stages other than said first stage and said last stage each further comprise:
a fifth transistor connected between said second node and said second voltage signal terminal and including a control electrode connected to said first input terminal; and
a sixth transistor connected between said second node and said first voltage signal terminal and including a control electrode connected to said second input terminal;

said first stage further comprises:
a first control signal terminal supplied with a first control signal;
a seventh transistor connected between said second node and said first control signal terminal and including a control electrode connected to said first input terminal; and
an eighth transistor connected between said second node and said first voltage signal terminal and including a control electrode connected to said second input terminal;

said last stage further comprises:
a second control signal terminal supplied with a second control signal;
a ninth transistor connected between said second node and said second voltage signal terminal and including a control electrode connected to said first input terminal; and
a tenth transistor connected between said second node and said second control signal terminal and including a control electrode connected to said second input terminal; and during a certain period after a lapse of the activation period of the output signal of said specific stage, said first and second voltage signals are brought to the deactivation level and said first and second control signals and said start pulse are brought to the activation level.

4. The scanning line driving circuit according to claim 3, wherein:

in forward shifting for shifting a signal from a preceding stage to a subsequent stage, said first control signal is brought to the deactivation level and said second control signal is brought to the activation level during an activation period of the start pulse at the start of the frame period; and in backward shifting for shifting a signal from a subsequent stage to a preceding stage, said first control signal is brought to the activation level and said second control signal is brought to the deactivation level during the activation period of the start pulse at the start of the frame period.

5. The scanning line driving circuit according to claim 3, wherein:

said first control signal is one of the clock signals supplied to the clock terminals at the respective stages of said multi-stage shift register; and said second control signal is another of the clock signals supplied to the clock terminals at the respective stages of said multi-stage shift register.

6. A scanning line driving circuit comprising a multi-stage shift register, wherein:

each stage of said multi-stage shift register comprises:
an output terminal for outputting an output signal;
a first input terminal receiving an output signal of a preceding stage;
a second input terminal receiving an output signal of a subsequent stage;
a first voltage signal terminal supplied with a first voltage signal;
a second voltage signal terminal supplied with a second voltage signal;
a clock terminal;
a first transistor supplying a clock signal input to said clock terminal to said output terminal;
a second transistor discharging said output terminal;
a third transistor connected between a first node connected with a control electrode of said first transistor and said first voltage signal terminal and including a control electrode connected to said first input terminal; and
a fourth transistor connected between said first node and said second voltage signal terminal and including a control electrode connected to said second input terminal;

each stage of said multi-stage shift register changes a scanning direction by switching levels of said first and second voltage signals;

in a case where a control electrode of said second transistor is connected to a second node at each stage of said multi-stage shift register, the stages other than said first stage and said last stage each further comprise:
a fifth transistor connected between said second node and said second voltage signal terminal and including a control electrode connected to said first input terminal; and
a sixth transistor connected between said second node and said first voltage signal terminal and including a control electrode connected to said second input terminal;

said first stage further comprises:
a first control signal terminal supplied with a first control signal;
a seventh transistor connected between said second node and said first control signal terminal and including a control electrode connected to said first input terminal; and an eighth transistor connected between said second node and said first voltage signal terminal and including a control electrode connected to said second input terminal;

said last stage further comprises:

a second control signal terminal supplied with a second control signal;

a ninth transistor connected between said second node and said second voltage signal terminal and including a control electrode connected to said first input terminal; and a tenth transistor connected between said second node and said second control signal terminal and including a control electrode connected to said second input terminal.

7. The scanning line driving circuit according to claim 6, wherein:

said first input terminal at the first stage and said second input terminal at the last stage of said multi-stage shift register receive the same start pulse; and during a certain period after a lapse of an activation period of an output signal at a specific stage of said multi-shift register, said first and second voltage signals are brought to a deactivation level and said first and second control signals and said start pulse are brought to an activation level, said specific stage being activated last during a frame period.

8. The scanning line driving circuit according to claim 7, wherein:

in forward shifting for shifting a signal from a preceding stage to a subsequent stage, said first control signal is brought to the deactivation level and said second control signal is brought to the activation level during an activation period of the start pulse at the start of the frame period; and in backward shifting for shifting a signal from a subsequent stage to a preceding stage, said first control signal is brought to the activation level and said second control signal is brought to the deactivation level during the activation period of the start pulse at the start of the frame period.

9. The scanning line driving circuit according to claim 7, wherein:

said first control signal is one of the clock signals supplied to the clock terminals at the respective stages of said multi-stage shift register; and said second control signal is another of the clock signals supplied to the clock terminals at the respective stages of said multi-stage shift register.

\* \* \* \* \*